(12) United States Patent
Otose

(10) Patent No.: US 12,008,972 B2
(45) Date of Patent: Jun. 11, 2024

(54) DISPLAY DEVICE

(71) Applicant: Shanghai Tianma Micro-Electronics Co., Ltd., Shanghai (CN)

(72) Inventor: Tomohiko Otose, Kanagawa (JP)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 18/072,375

(22) Filed: Nov. 30, 2022

(65) Prior Publication Data

US 2023/0206873 A1   Jun. 29, 2023

(30) Foreign Application Priority Data

Dec. 28, 2021   (JP) .................................. 2021-214169

(51) Int. Cl.
G09G 3/36        (2006.01)
G11C 19/28       (2006.01)

(52) U.S. Cl.
CPC ........... G09G 3/3648 (2013.01); G11C 19/28 (2013.01); *G09G 2310/0286* (2013.01)

(58) Field of Classification Search
CPC ........... G11C 19/28; G09G 2310/0286; G09G 3/3648; G09G 3/3674; G09G 3/3677; G09G 2310/08
See application file for complete search history.

(56) References Cited

U.S. PATENT DOCUMENTS

| | | | | |
|---|---|---|---|---|
| 2010/0182306 A1* | 7/2010 | Kimura | ..................... | G09G 3/14 345/213 |
| 2011/0316831 A1* | 12/2011 | Ochiai | ................. | G09G 3/3674 345/208 |
| 2012/0113088 A1 | 5/2012 | Han et al. | | |
| 2014/0064437 A1* | 3/2014 | Qi | .......................... | G11C 19/28 377/64 |
| 2018/0308444 A1 | 10/2018 | Sueki et al. | | |

* cited by examiner

*Primary Examiner* — Xuemei Zheng
(74) *Attorney, Agent, or Firm* — NIXON & VANDERHYE

(57) ABSTRACT

A display device includes pixel circuit rows, selection lines connected to the pixel circuit rows, and a shift register including linked shift register units. The shift register units output sequential selection pulses to the selection lines. Each of the shift register units outputs the selection pulse to a corresponding selection line among the selection lines. Each of the shift register units includes thin film transistors of a first conductivity type that are connected in parallel, and that, during an ON state, connect the corresponding selection lines to a fixed potential wiring line for applying a non-selection level for the selection pulse. During each frame period, the thin film transistors are turned ON/OFF by clock signals in different phases. The duty cycle of the ON period of each of the thin film transistors during each said frame period is 12.5% or less.

10 Claims, 19 Drawing Sheets

DUTY50%
2CLK

DUTY25%
4CLK

DUTY12.5%
8CLK

DUTY10%
10CLK

DUTY6.25%
16CLK

DUTY5%
20CLK

*FIG. 8*

DISPLAY DEVICE

CROSS-REFERENCE TO RELATED APPLICATIONS

This non-provisional application claims priority under 35 U.S.C. § 119(a) on Patent Application No. 2021-214169 filed in Japan on Dec. 28, 2021, the entire content of which is hereby incorporated by reference.

BACKGROUND

The present disclosure relates to a display device.

LCD (liquid crystal display) devices and OLED (organic light-emitting diode) display devices are widely used as display devices. Such display devices include shift registers for driving (selecting) scanning lines for selecting pixel rows to which data signals are to be written.

Additionally, OLED display devices that measure the characteristics of elements of a display device (drive transistor, OLED) and correct the data signals on the basis of the measurement results are also known. Such OLED display devices that perform external compensation on the data signals include shift registers that output control signals for measurement to a measurement control line.

As applications for use of display devices broaden, demand for non-rectangular display devices has increased due to considerations of appearance. In order to realize a non-rectangular display device, it is necessary to form a driver circuit including such shift registers by a thin film process performed on an insulating substrate. Also, display devices are used in various environments, and thus, reliability is an increasingly important requirement.

SUMMARY

An aspect of the present disclosure is a display device including: a plurality of pixel circuit rows; a plurality of selection lines connected to the plurality of pixel circuit rows; and a shift register including a plurality of linked shift register units. The plurality of shift register units output sequential selection pulses to the plurality of selection lines. Each of the plurality of shift register units outputs the selection pulse to a corresponding selection line among the plurality of selection lines. Each of the shift register units includes a plurality of thin film transistors of a first conductivity type that are connected in parallel, and that, during an ON state, connect the corresponding selection lines to a fixed potential wiring line for applying a non-selection level for the selection pulse. During each frame period, the plurality of thin film transistors are turned ON/OFF by clock signals in different phases. The duty cycle of the ON period of each of the plurality of thin film transistors during each said frame period is 12.5% or less.

It is to be understood that both the foregoing general description and the following detailed description are exemplary and explanatory and are not restrictive of the present disclosure.

BRIEF DESCRIPTION OF THE DRAWINGS

FIG. 8 schematically shows the relationship between the number of clock signals and the duty cycle;

DETAILED DESCRIPTION OF EMBODIMENTS

Figure 1:
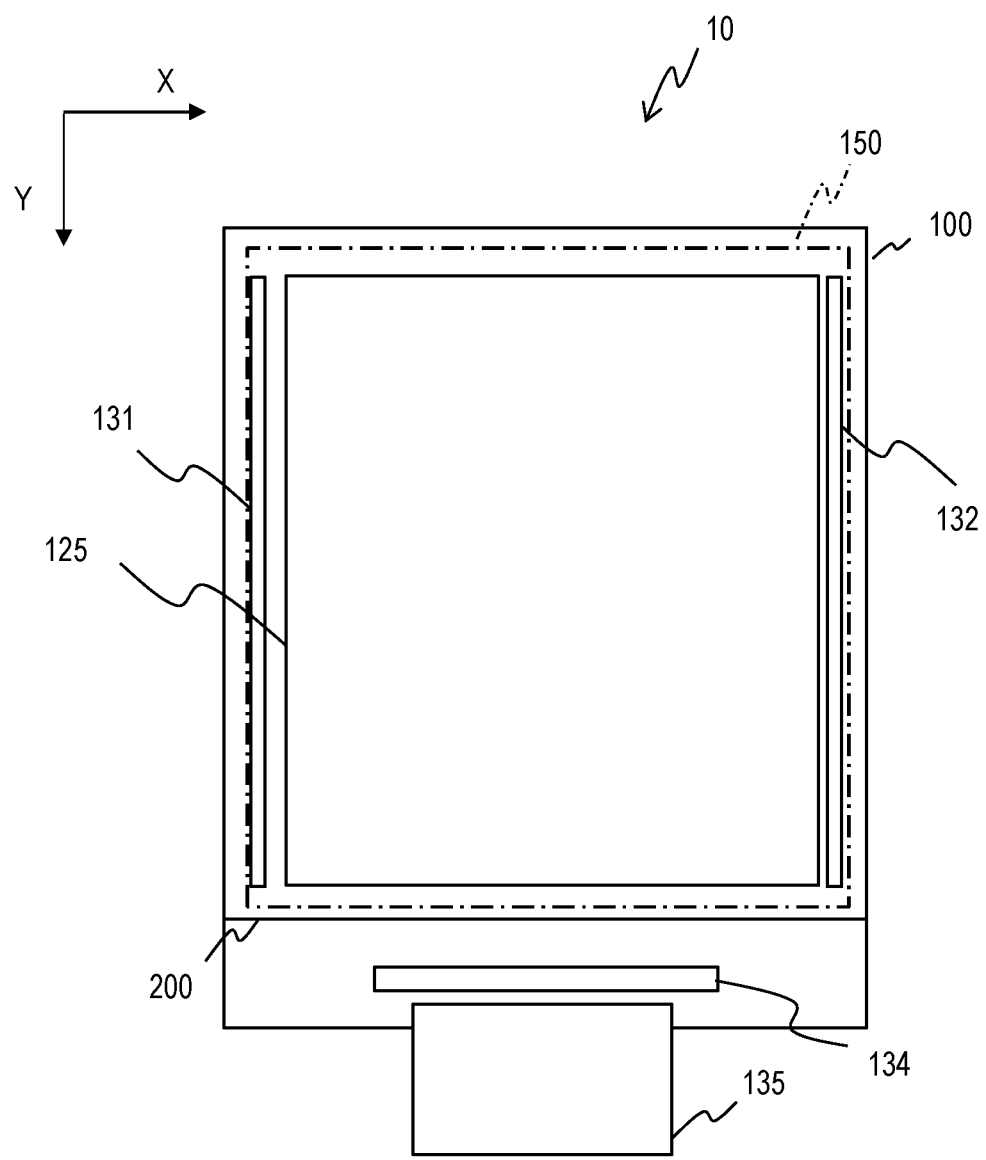
FIG. 1 schematically shows a configuration example of liquid crystal display device.

Hereinafter, embodiments of the present disclosure will be described with reference to the accompanying drawings. It should be noted that the embodiments are merely examples to implement the present disclosure and are not to limit the technical scope of the present disclosure. Elements common to the drawings are denoted by the same reference signs.

Outline

Below, a circuit configuration that can be used in a scanning circuit of an LCD (liquid crystal display) device, an OLED (organic light-emitting diode) display device, or the like will be described. A scanning circuit according to one embodiment of the present specification includes shift registers that can output scanning signals of the LCD or OLED display device, light emission control signals of the OLED display device, and the like. The shift registers include a plurality of connected shift register units.

The shift registers sequentially select selection lines such as scanning lines or light emission control lines. The shift registers are connected to wiring lines that apply either one of a low or high potential during a selection period and are connected to wiring lines that apply the other of the low or high potential during a non-selection period. The driver circuit connects the selection lines to potential supply wiring lines by turning ON/OFF TFTs that connect the selection lines to wiring lines that apply the high or low potential.

If TFTs are in the ON state for a long period of time, this results in a fluctuation in characteristics due to bias stress, resulting in a decrease in driving performance. If the driving performance of the TFTs that apply low or high potential to the selection lines decreases, this can result in a decrease in display quality of the display device.

The scanning circuit of the display device according to one embodiment of the present specification includes shift registers that output sequential selection pulses to the selection lines. Each shift register unit of the shift register includes a plurality of thin film transistors of a first conductivity type that are connected in parallel, that output a selection pulse to the corresponding selection line, and that connect the corresponding selection line to a wiring line that applies a non-selection level of the selection pulse during the ON state. During each frame period, the plurality of thin film transistors are turned ON/OFF by clock signals in different phases. As a result, it is possible to reduce the duty cycle of the ON period of the thin film transistors.

Below, embodiments will be specifically described with reference to the drawings. The same reference characters are assigned to common components in the respective drawings. In order to increase the clarity of the description, dimensions, shapes, and the like of depicted objects are sometimes exaggerated.

Embodiment 1

Overall Configuration

FIG. 1 schematically shows a configuration example of liquid crystal display device 10. The characteristics of the present disclosure can also be applied to other display devices such as OLED display devices. The liquid crystal display device 10 includes a liquid crystal display panel and a control device. The liquid crystal display panel includes a TFT (thin film transistor) substrate 100 having formed thereon electrodes for applying electric fields to TFTs and a liquid crystal, an opposite substrate 200, and a sealing unit 150 that bonds the TFT substrate 100 to the opposite substrate 200. A liquid crystal material is sealed between the TFT substrate 100 and the opposite substrate 200.

Scanning drivers 131 and 132 and a driver IC 134 are disposed on the outside of a display region 125 of the TFT substrate 100. The driver IC 134 is connected to an external device via an FPC (flexible printed circuit) 135. The scanning drivers 131 and 132 and the driver IC 134 are included in the control device, and are also referred to as driver circuits.

The scanning drivers 131 and 132 are disposed opposite each other across the display region 125. In the example of FIG. 1, the scanning drivers 131 and 132 are disposed on the left and right sides of the display region 125, respectively. The scanning drivers 131 and 132 drive different scanning lines of the TFT substrate 100 or drive the scanning lines simultaneously. Either one of these steps may be omitted.

The driver IC 134 is installed using an anisotropic conductive film (ACF), for example. The driver IC 134 applies power source and timing signals (control signals) to the scanning drivers 131 and 132 and also apply signals corresponding to image data to data lines.

Figure 2:
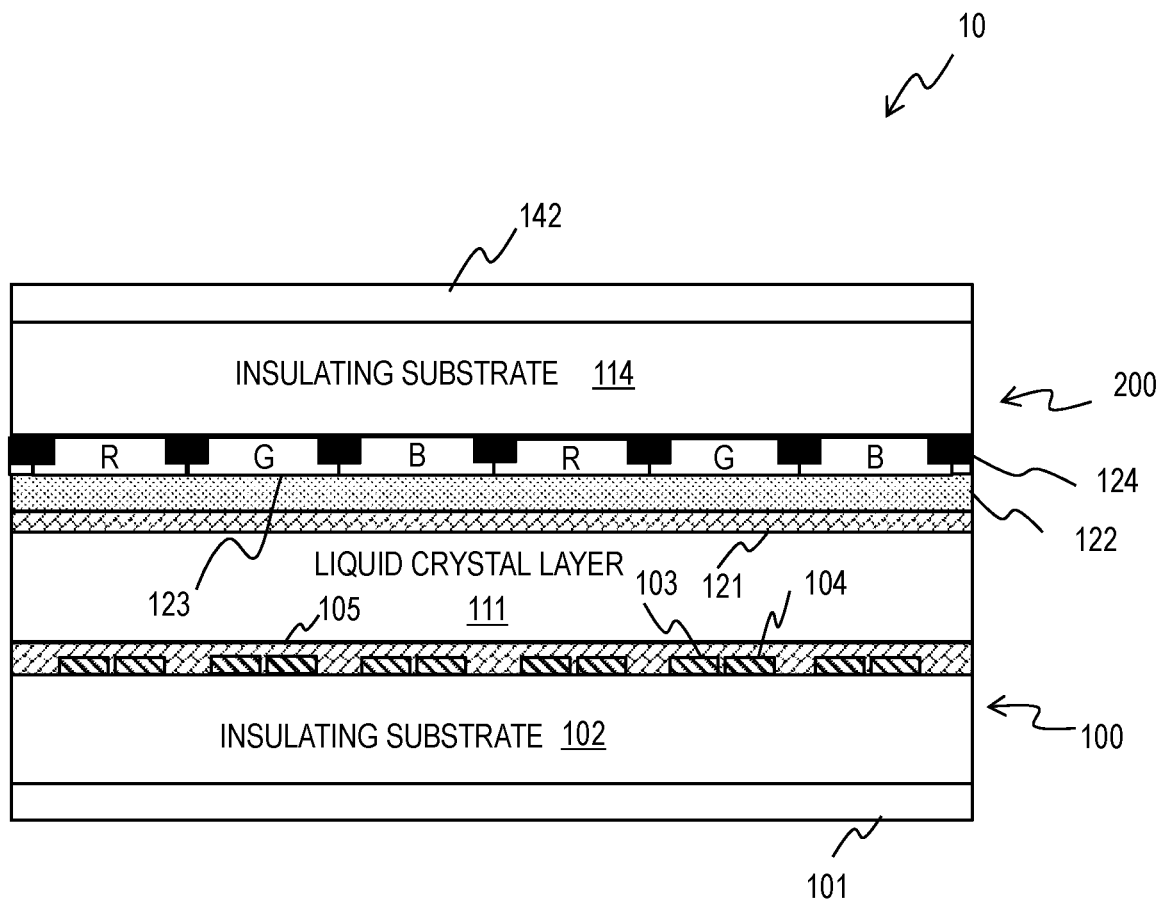
FIG. 2 schematically shows the cross-sectional structure of the liquid crystal display device.

FIG. 2 schematically shows the cross-sectional structure of the liquid crystal display device 10. FIG. 2 shows the partial configuration of the liquid crystal display device 10 and some of the configuration including a backlight unit are omitted from depiction. The liquid crystal display panel includes the TFT substrate 100, and the opposite substrate 200, which opposes the TFT substrate 100. A liquid crystal layer 111 is sandwiched between the TFT substrate 100 and the opposite substrate 200. The liquid crystal display device 10 additionally includes a backlight unit (not shown).

The TFT substrate 100 includes an insulating substrate 102. The insulating substrate 102 is an insulating transparent substrate made of glass or resin. The insulating substrate 102 is rectangular, for example, and one main surface thereof opposes one main surface of the opposite substrate 200. A polarizing plate 101 is attached to the main surface of the insulating substrate 102 on the opposite side to the liquid crystal layer 111.

On the main surface of the insulating substrate 102 facing the liquid crystal layer 111, driving electrodes 103 (also referred to as pixel electrodes) for applying an electric field to the liquid crystal layer 111 and common electrodes 104 (also referred to as opposite electrodes) are arrayed. Each pair of driving electrode 103 and common electrode 104 applies an electric field to the liquid crystal of one pixel. The amount of transmitted light at the pixel changes according to the applied electric field. A TFT array (not shown) for selecting the pixels to control is formed on the insulating substrate 102.

The configuration example shown in FIG. 2 is of a transverse electric field liquid crystal display device. Examples of transverse electric field liquid crystal display devices include IPS (in-plane switching) or FFS (fringe-field switching) liquid crystal display devices. In FIG. 2, only the driving electrode and common electrode of one of the plurality of pixels are labeled with the reference characters 103 and 104, respectively.

An alignment film 105 is layered so as to cover the electrode layer including the driving electrodes 103 and the common electrodes 104. The alignment film 105 is in contact with the liquid crystal layer 111 and defines the orientation state of the liquid crystal molecules when no electric field is applied.

In the configuration example of FIG. 2, the opposite substrate 200 is a CF substrate including color filters (CFs). The opposite substrate 200 may alternatively not include color filters. The opposite substrate 200 is an insulating substrate 141 made of glass or resin. The insulating substrate 141 is rectangular, for example. A polarizing plate 142 is attached to the main surface of the insulating substrate 141 on the opposite side to the liquid crystal layer 111.

A black matrix 124 in a grid pattern that defines the pixels is layered on the main surface of the insulating substrate 141 facing the liquid crystal layer 111. The black matrix 124 is a black resin or a metallic thin film made of a chromium-type material, for example. A color filter 123 of red, green, or blue is formed in each pixel region surrounded by the black matrix 124.

An insulating overcoat layer 122 is layered on the color filters 123. The overcoat layer 122 may be omitted. An alignment film 121 is layered on the overcoat layer 122. The alignment film 121 is in contact with the liquid crystal layer 111 and defines the orientation state of the liquid crystal molecules when no electric field is applied.

The backlight unit (not shown) is disposed on the rear surface (rear side) of the liquid crystal display panel. Either one of the TFT substrate 100 and the opposite substrate 200 is the front side where the user viewing an image is present, and the other is the rear side. That is, the backlight unit is disposed on the TFT substrate 100 side or the opposite substrate 200 side of the liquid crystal display panel shown in FIG. 2.

The liquid crystal layer 111 controls the amount transmitted of light from the backlight unit at each pixel according to the electric field between each driving electrode 103 and common electrode 104. The driver IC 134 controls the potentials of the driving electrode 103 and the common electrode 104 of each pixel. The driver IC 134 controls the potentials of the driving electrode 103 and the common electrode 104 of each pixel according to the image data to control the amount of light transmitted at the pixel.

Pixel Circuit Configuration

Figure 3A:
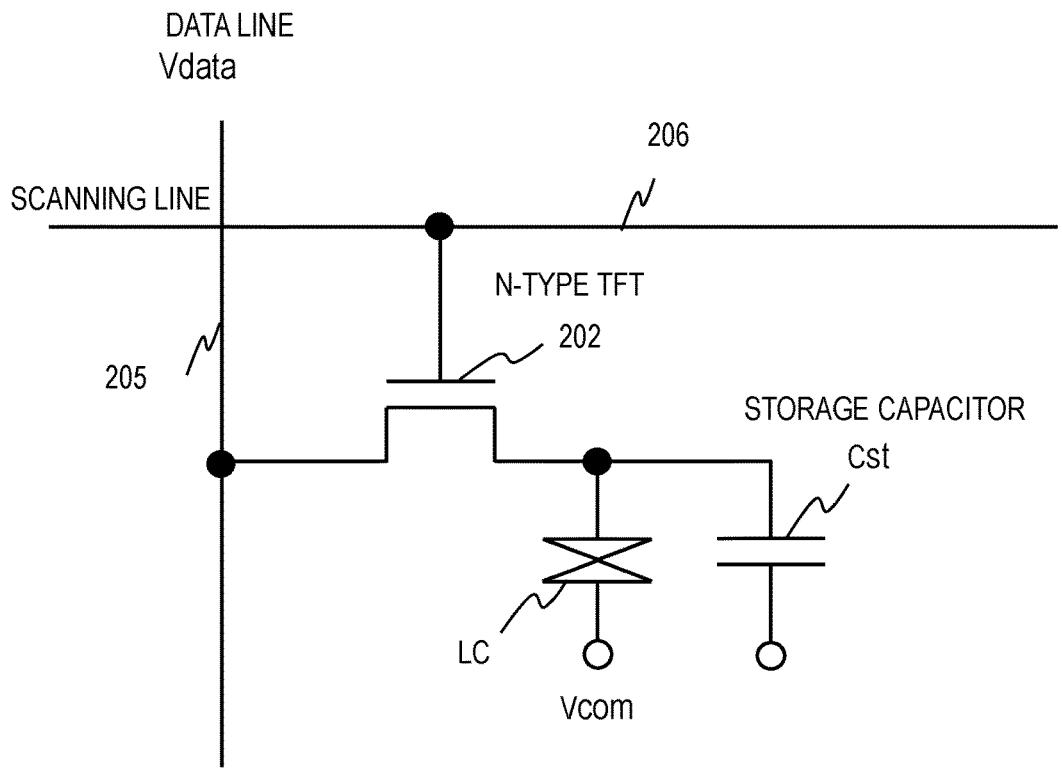
FIGS. 3A and 3B show respective examples of pixel circuits of the liquid crystal display device.
Figure 3B:
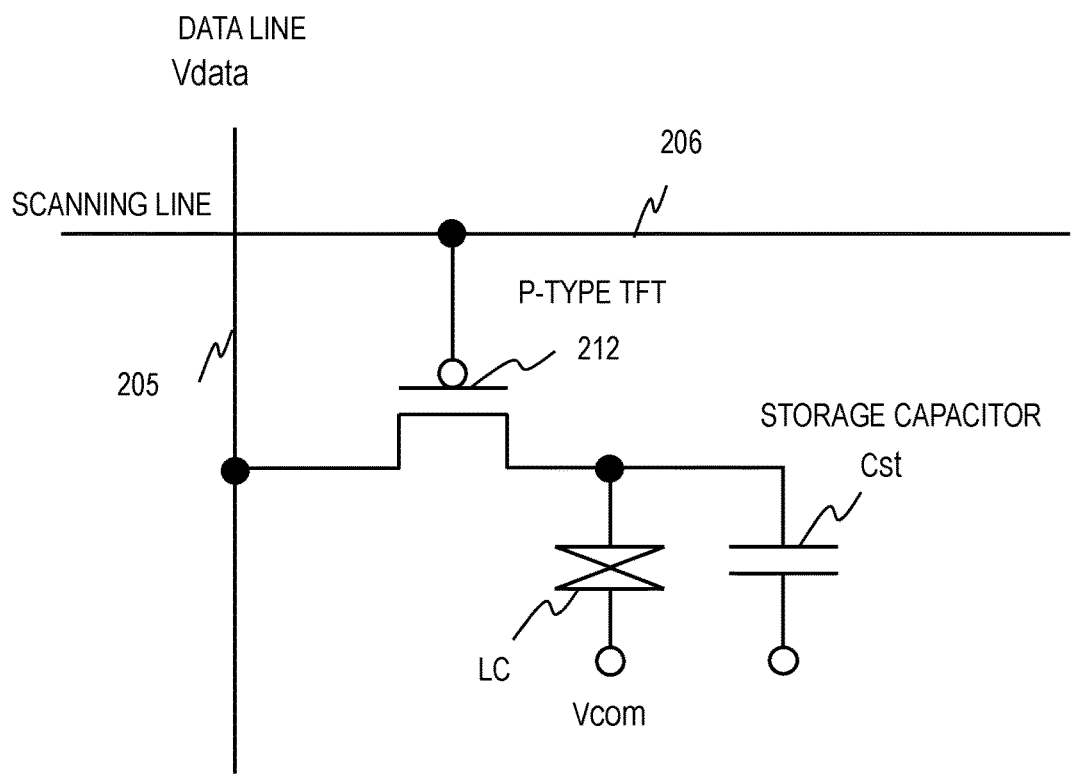

Next, examples of pixel circuits of the liquid crystal display device will be described. FIGS. 3A and 3B show respective examples of pixel circuits of the liquid crystal display device. The pixel circuit example of FIG. 3A includes an N-type switch TFT 202, a storage capacitor CST, and liquid crystal LC between the common electrode and the pixel electrode. A common potential Vcom is applied to the common electrode. The N-type switch TFT 202 may be an amorphous silicon TFT, an oxide semiconductor TFT, or a low temperature polysilicon TFT, for example.

The scanning driver 131 and/or 132 outputs a selection pulse to the scanning line 206, switching the N-type switch thin film transistor 202 to the ON state. The selection level (pulse level) of the selection pulse is the high level, and the non-selection level (reference level) is the low level.

The scanning line 206 is connected to one or both of the scanning drivers 131 and 132. The data line 205 applies the data signal to the pixel electrode and the storage capacitor CST via the N-type switch TFT 202 in the ON state. The data signal is applied to the data line 205 from the driver IC 134.

The pixel circuit example of FIG. 3B includes a P-type switch TFT 212, a storage capacitor CST, and liquid crystal LC between the common electrode and the pixel electrode. A common potential Vcom is applied to the common electrode. The P-type switch TFT 212 may be a low temperature polysilicon TFT, for example.

The scanning driver 131 and/or 132 outputs a selection pulse to the scanning line 206, switching the P-type switch TFT 212 to the ON state. The selection level (pulse level) of the selection pulse is the low level, and the non-selection level (reference level) is the high level.

The scanning line 206 is connected to one or both of the scanning drivers 131 and 132. The data line 205 applies the data signal to the pixel electrode and the storage capacitor CST via the P-type switch TFT 212 in the ON state. The data signal is applied to the data line 205 from the driver IC 134.

Scanning Driver Circuit

Below, a circuit configuration example of the scanning drivers that control the pixel circuits including the N-type switch TFTs shown in FIG. 3A will be described. The scanning lines extend along the X axis direction and are arrayed in the Y axis direction of FIG. 1. The scanning drivers output gate signals (selection signals) sequentially to the scanning lines arrayed in the Y axis direction.

Figure 4:
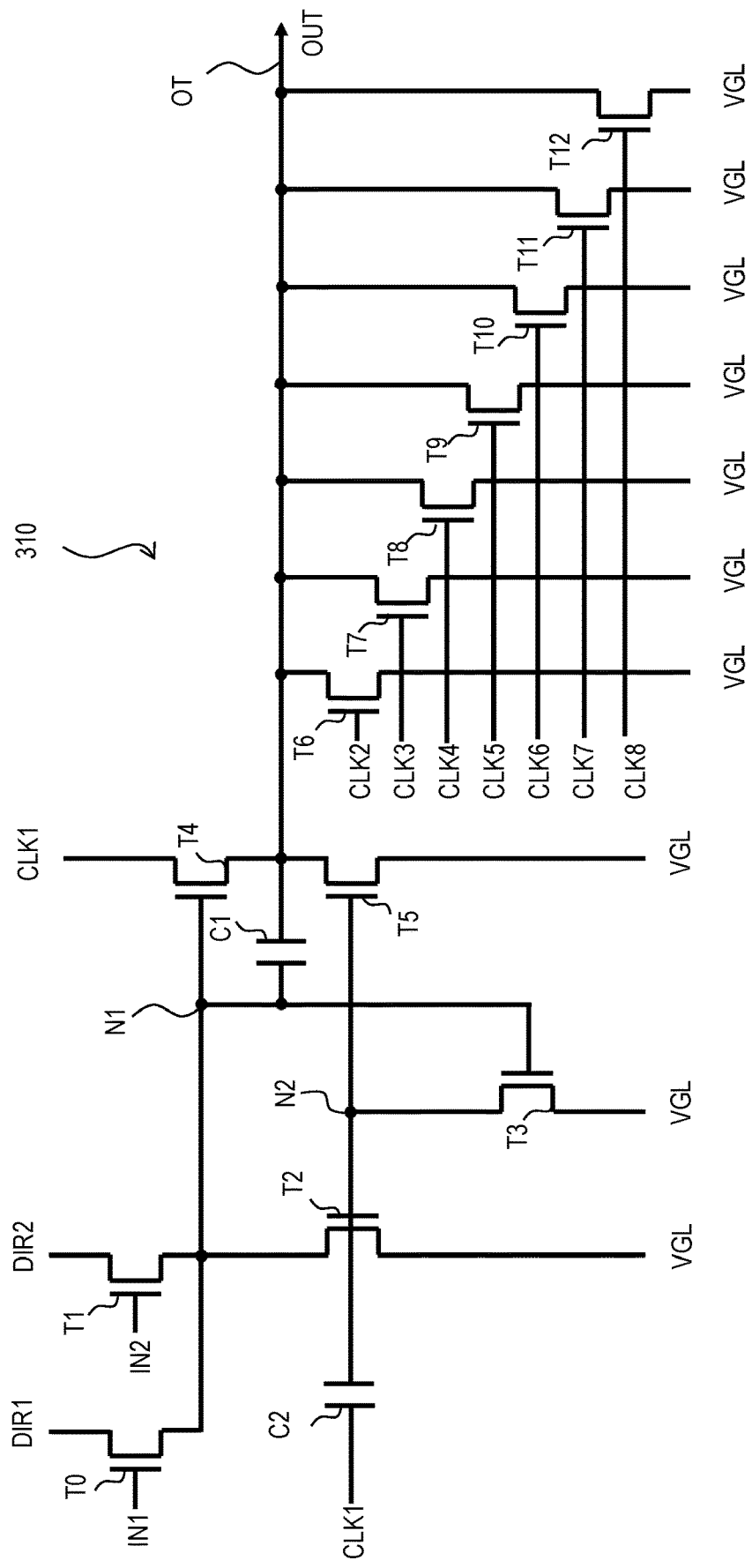
FIG. 4 schematically shows the circuit configuration of one stage of shift registers.

FIG. 4 schematically shows the circuit configuration of one stage of shift registers 310 (also referred to as flip-flops or shift register units). The scanning drivers 131 and 132 each include a shift register including a plurality of shift register units 310 linked in multiple stages. The shift register units of the scanning drivers 131 and 132 can have the configuration shown in FIG. 4.

An output signal OUT of the shift register units 310 shown in FIG. 4 is a gate signal of the N-type TFTs 202 of the pixel circuits shown in FIG. 3A. The shift register units apply a high potential level output signal pulse to the gates of the N-type TFTs 202. As a result, the N-type TFTs 202 are turned ON. In the circuit described below, the N-type TFTs 202 of the pixel circuits and the N-type TFTs of the shift register units may be amorphous silicon TFTs. Also, the transistors of the shift register units are switch TFTs that turn ON or OFF.

Signals inputted to the shift register units 310 include signals IN1, IN2, DIR1, DIR2, and CLK1 to CLK8. The signals DIR1 and DIR2 are control signals for selecting the scan direction (shift direction) of the shift register. CLK1 to CLK8 are clock signals. The signal IN1 is an input signal from one previous stage shift register unit and the signal IN2 is an input signal from another previous stage shift register unit. Only one of the input signals generates a pulse according to the scan direction of the shift register and the other input signal is maintained at VGL. The input signal to the first shift register unit in the shift register is a start signal.

Also, a constant low power source potential VGL is applied to the shift register unit 310. The signals IN1, IN2, DIR1, DIR2, and CLK1 to CLK8 inputted to the shift register units change between a constant high power source potential VGH (high level) and the low power source potential VGL (low level).

The shift register units 310 apply the output signal OUT from the output line OT to the scanning line 206. The shift register unit 310 includes 13 transistors T0 to T12 and two capacitors C1 and C2.

Either one of the source or the drain of the transistor T0 is supplied a control signal DIR1 that controls the scanning direction of the shift register, and the other is connected to a node N1. The gate of the transistor T0 is supplied an input signal IN1. Either one of the source or the drain of the transistor T1 is supplied a control signal DIR2 that controls the scanning direction of the shift register, and the other is connected to the node N1. The gate of the transistor T1 is supplied an input signal IN2.

Either one of the source or the drain of the transistor T2 is supplied a low power source potential VGL, and the other is connected to the node N1. The gate of the transistor T2 is connected to node N2. The gate of the transistor T2 is supplied the clock signal CLK1 via the capacitor C2 or the low power source potential VGL via the transistor T3. The transistor T2 is a pull-down TFT that lowers the potential of the node N1 to the low power source potential VGL. The transistor T2 is an example of the third thin film transistor.

Either one of the source or the drain of the transistor T3 is supplied a low power source potential VGL, and the other is connected to the node N2. The gate of the transistor T3 is connected to the node N1. The gate of the transistor T3 is supplied the control signal DIR1 or DIR2 via the transistor T0 or T1, or supplied the low power source potential VGL via the transistor T2.

Either one of the source or the drain of the transistor T4 is supplied the clock signal CLK1, and the other is connected to the output line OT. The gate of the transistor T4 is connected to the node N1. The potential of the gate of the transistor T4 is the same as the potential of the gate of the transistor T3. The transistor T4 is an example of the second thin film transistor, which supplies a selection level (high level) of a selection pulse during the ON state.

The transistors T5 to T12 are pull-down N-type TFTs that lower the potential of the output line OT to the low power source potential VGL. The transistors T5 to T12 are connected in parallel between the output line OT and the power source line, which supplies the low power source potential VGL. Specifically, either one of the source and the drain of each of the transistors T5 to T12 is connected to the output line OT and the other is connected to the wiring line that supplies the low power source potential VGL.

The gate of the transistor T5 is connected to node N2. The potential of the gate of the transistor T5 is the same as the potential of the gate of the transistor T2. The gates of the transistors T6 to T12 are respectively supplied the clock signals CLK2 to CLK8. As will be described later, the transistors T6 to T12 and T5 are sequentially turned ON, and the low power source potential VGL is supplied to the output line OT. In the configuration example of FIG. 4, all transistors that perform a pull-down on the output line are controlled by clock signals in different phases. The transistors T5 to T12 have the same channel width and the same pull-down performance, for example. The transistors T5 to T12 may have the same structure.

The first end of the capacitor C1 is connected to the node N1 and the second end is connected to the output line OT. The first end of the capacitor C2 is connected to the node N2 and the second end is supplied the clock signal CLK1. The capacitor C1 is a bootstrap capacitor that applies a bootstrap effect on the potential of the node N1. The capacitor C2 can suitably apply the clock signal CLK1 and the low power source potential VGL to the node N2.

Figure 5:
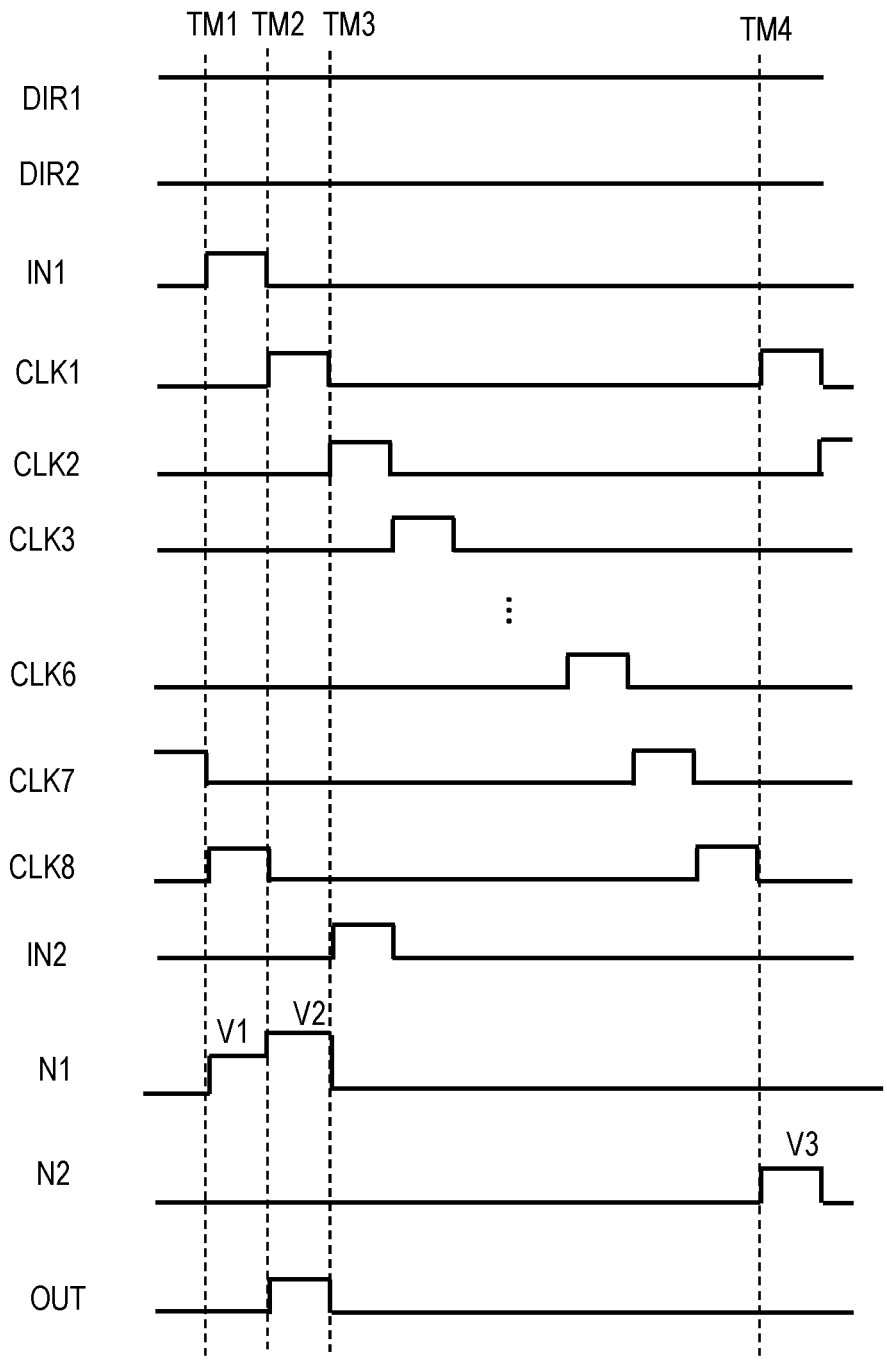
FIG. 5 is a sequence diagram showing the change over time in the input signal of the shift register unit, the potential of the node N1, the potential of the node N2, and the output signal OUT.

FIG. 5 is a sequence diagram showing the change over time in the input signal of the shift register unit 310, the potential of the node N1, the potential of the node N2, and the output signal OUT. The time TM1 is the starting time for control of the shift register unit 310 corresponding to one frame (image frame) of image data.

In the example of FIG. 5, the control signal DIR1 is always at a high level (VGH), and the control signal DIR2 is always at a low level (VGL). This signifies that the scanning direction of the shift register is maintained in the direction indicated by the control signal DIR1.

At the time TM1, the input signal IN1 switches from VGL to VGH. Other signals are at VGL. As a result of the input signal IN1 reaching VGH, the transistor T0 enters the ON state. The control signal DIR1 is applied to the node N1. The control signal DIR1 is at VGH, and the potential of the node N1 rises from VGL to V1. The potential V1 of the node N1 is essentially VGH, and more accurately, is VGH-Vt where the threshold of the transistor T0 is Vt.

As a result of the potential of the node N1 rising, the transistor T3 enters the ON state. The node N2 and the low power source potential line are connected to each other via the transistor T3. The potential of the node N2 is at VGL. Also, as a result of the potential of the node N1 rising, the transistor T4 enters the ON state. The clock signal CLK1 is at VGL, and the output signal OUT is also at VGL.

Next, at the time TM2, the input signal IN1 reaches VGL, and the transistor T0 enters the OFF state. Additionally, the clock signal CLK1 switches from VGL to VGH. The transistor T4 is in the ON state and the potential of the output signal OUT rises to the high level. The potential of the output signal OUT is essentially VGH, and more accurately, is VGH-Vt where the threshold of the transistor T0 is Vt.

At this time, the node N1 is in a floating state. Thus, as a result of the bootstrap effect, the potential of the node N1 rises from V1 to V2 via the capacitor C1. The potential V2 is 2VGH-VGL-Vt, and is the maximum potential for the node N1. As a result of the potential of the node N1 rising, the transistor T4 is maintained in the ON state.

Next, at the time TM3, the clock signal CLK1 switches to VGL. As a result, the potential of the node N1 reaches VGL, and the transistors T3 and T4 enter the OFF state. The node N2 is in a floating state and the potential remains at VGL. Thus, the transistor T5 is in the OFF state.

Additionally, the clock signal CLK2 switches to VGH. As a result, the transistor T6 enters the ON state. The output line OT and the low power source line are connected to each other via the transistor T6, and the output signal OUT switches to the low level (VGL). The input signal IN2 switches to VGH according to the output of the shift register unit in the next stage, but the signal DIR2 is at VGL and the potential of the node N1 does not change.

The clock signals CLK2 to CLK8 sequentially generate a high level pulse (ON pulse) in the stated order from times TM3 to TM4. As a result, the transistors T6 to T12 sequentially enter the ON state. In the example of FIG. 5, the rise and fall of consecutive ON pulses occur simultaneously. Some time may elapse between the fall of the immediately previous ON pulse and the rise of the subsequent ON pulse. Alternatively, a configuration may be adopted in which a portion of consecutive ON pulses overlap, or in other words, the fall of the immediately previous ON pulse occurs after the rise of the subsequent ON pulse.

At the time TM4, the clock signal CLK1 switches to VGH, and thus, the potential of the node N2 rises to V3 via the capacitor C2. The potential V3 is VGH-α, where a coefficient α that takes into consideration the gate capacitance of the transistors T2 and T5 and the drain capacitance of the transistor T3 is used. The transistors T2 and T5 switch to the ON state and the output signal OUT is maintained at VGL. The transistor T2 turns ON/OFF in a manner similar to the transistor T5.

After the time TM4, generation of the ON pulse is repeated in the order of the clock signals CLK1 to CLK8. As a result, the transistors T5 to T12 cyclically and sequentially enter the ON state. In the example shown in FIG. 5, the clock signals CLK1 to CLK8 respectively generate the ON pulse periodically. All clock signals CLK1 to CLK8 are synchronized, and the clock frequency and the clock width (ON pulse width) thereof are the same in the example of FIG. 5. Also, the phases of all of the clock signals CLK1 to CLK8 differ from each other. The clock period of the clock signals CLK1 to CLK8 is eight times the pulse width.

In the example shown in FIG. 5, consecutive clock signals simultaneously reach VGH or VGL. A configuration may be adopted in which, from the time TM3, any one of the transistors T5 to T12 is in the ON state until the input signal IN1 rises in order to write data for the next frame period (until the time TM1 of the next frame period), with the output line OT always being connected to the low power source line. The output line may be floating from when the last pull-down TFT switches from the ON state to the OFF state to the time TM1 of the next frame period.

Figure 6A:
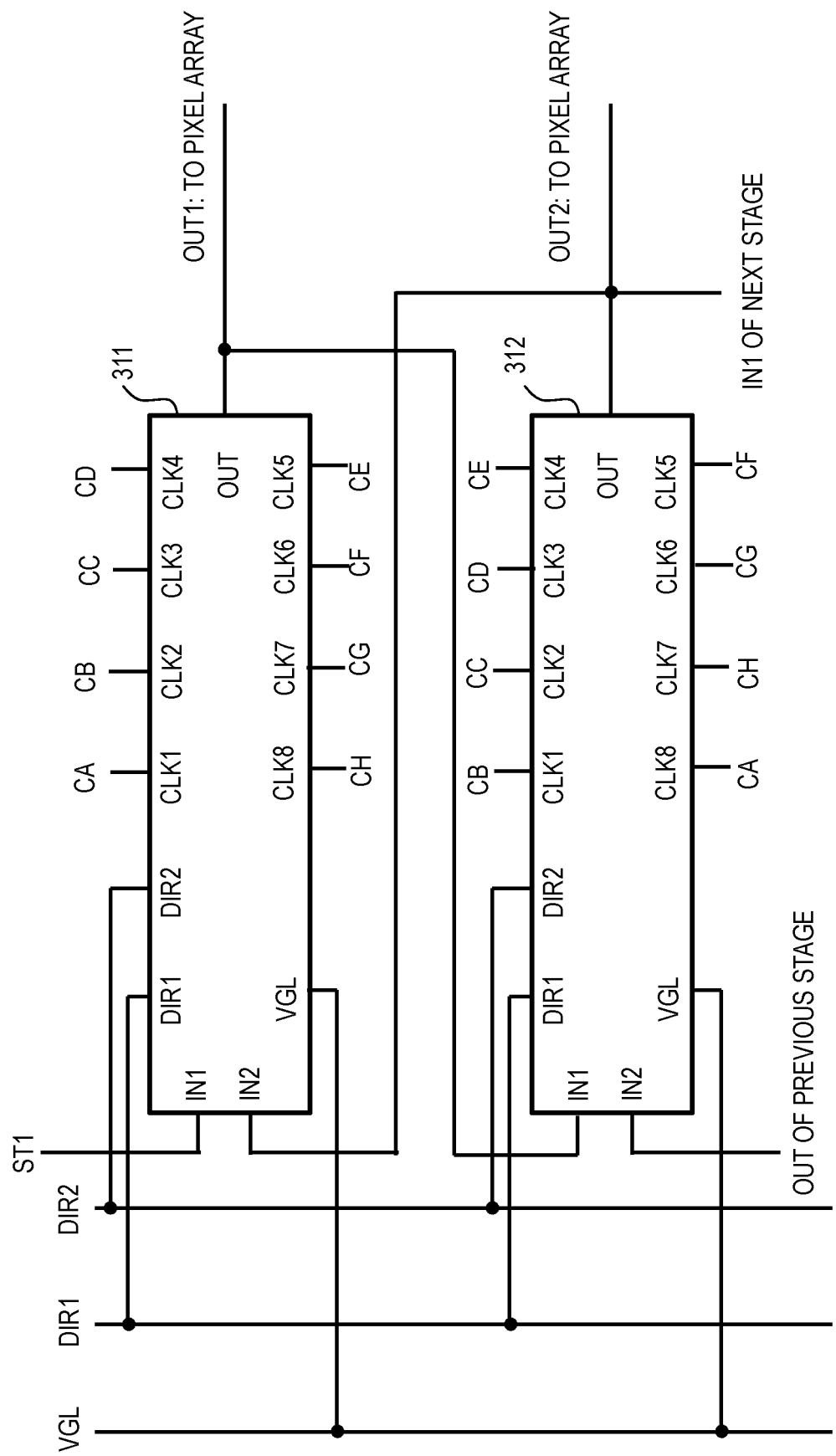
FIG. 6A shows a portion of a shift register that can be installed in the scanning driver.

FIG. 6A shows a portion of a shift register that can be installed in the scanning driver 131 or 132. Specifically, FIG. 6A shows the highest stage shift register unit 311 and a lower stage shift register unit 312 (next stage or previous stage) therefrom. The shift register units 311 and 312 can each have the circuit configuration and operation described with reference to FIGS. 4 and 5. In this example, the shift register is constituted of 8N linked shift register units (N being positive integer).

Each shift register unit includes a plurality of signal terminals. One signal terminal is an output signal terminal for the output signal OUT. Other signal terminals are input signal terminals for the signals IN1, IN2, DIR1, DIR2, and CLK1 to CLK8 and the low power source potential VGL described with reference to FIGS. 4 and 5.

The input signal terminals have inputted thereto signals and the low power source potential VGL from the outside. Specifically, the control signals DIR1 and DIR2 are inputted to the respective signal terminals therefor. A start signal ST1 is inputted to the signal terminal for the signal IN1 of the highest stage shift register unit 311. An output signal OUT1 of the upper stage (previous stage) shift register unit 311 is inputted to the signal terminal for the signal IN1 of the lower stage shift register unit 312.

The output signal OUT of the lower stage (previous stage) shift register unit (not shown) therefrom is inputted to the signal terminal for the signal IN2 of the shift register unit 312. An output signal OUT2 of the lower stage (previous stage) shift register unit 312 is inputted to the signal terminal for the signal IN2 of the shift register unit 311.

The signal terminals for the clock signals CLK1 to CLK8 have inputted thereto any of the clock signals CA to CH. In the shift register unit 311, the clock signals CA to CH are inputted respectively to the signal terminals for the clock signals CLK1 to CLK8. In the shift register unit 312, the signal terminals for the clock signals CLK1 to CLK8 have inputted thereto the clock signals CB to CH and CA.

Figure 6B:
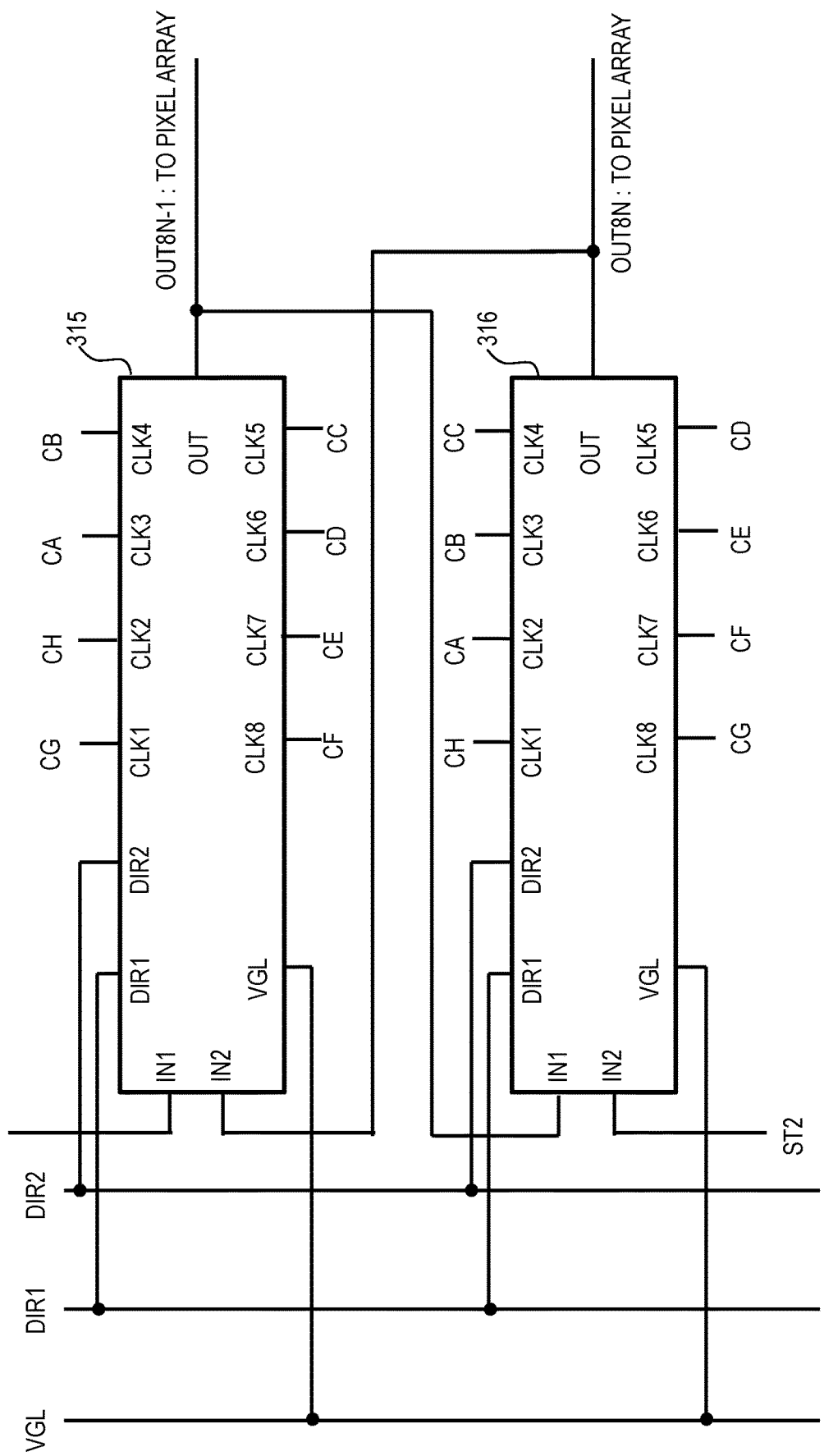
FIG. 6B shows another portion of the shift register that can be installed in the scanning driver.

FIG. 6B shows another portion of the shift register that can be installed in the scanning driver 131 or 132. Specifically, FIG. 6B shows the lowest stage shift register unit 316 and an upper stage shift register unit 315 (next stage or previous stage) therefrom. The shift register units 315 and 316 are 8N-1th and 8Nth shift register units from the highest stage. The shift register units 315 and 316 can each have the circuit configuration and operation described with reference to FIGS. 4 and 5.

The difference from the shift register units 311 and 312 will be primarily described here. The output signal OUT of the upper stage (previous stage) shift register unit (not shown) is inputted to the signal terminal for the signal IN1 of the shift register unit 315. An output signal UT8N-1 of the upper stage (previous stage) shift register unit 315 is inputted to the signal terminal for the signal IN1 of the shift register unit 316.

A start signal ST2 is inputted to the signal terminal for the signal IN2 of the shift register unit 316. An output signal OUT8N of the lower stage (previous stage) shift register unit 316 is inputted to the signal terminal for the signal IN2 of the shift register unit 315.

In the shift register unit 315, the signal terminals for the clock signals CLK1 to CLK8 have inputted thereto the clock signals CG, CH, and CA to CF. In the shift register unit 316, the clock signals CH and CA to CG are inputted respectively to the signal terminals for the clock signals CLK1 to CLK8.

The shift register units are classified into eight groups, and the same clock signal is inputted to the clock signal terminals of shift register units in the same group. The clock signals inputted to the clock signal terminals differ among different groups. Specifically, in the 8k-7th shift register unit from the highest stage, the clock signals CA to CH are inputted respectively to the signal terminals for the clock signals CLK1 to CLK8. k is an integer of 1 or greater.

In the 8k-6th shift register unit, the signal terminals for the clock signals CLK1 to CLK8 have inputted thereto the clock signals CB to CH and CA. In the 8k-5th shift register unit, the signal terminals for the clock signals CLK1 to CLK8 have inputted thereto the clock signals CC to CH, CA, and CB. In the 8k-4th shift register unit, the signal terminals for the clock signals CLK1 to CLK8 have inputted thereto the clock signals CD to CH and CA to CC.

In the 8k-3rd shift register unit, the signal terminals for the clock signals CLK1 to CLK8 have inputted thereto the clock signals CE to CH and CA to CD. In the 8k-2nd shift register unit, the signal terminals for the clock signals CLK1 to CLK8 have inputted thereto the clock signals CF to CH and CA to CE. In the 8k-1st shift register unit, the signal terminals for the clock signals CLK1 to CLK8 have inputted thereto the clock signals CG, CH and CA to CF. In the 8kth shift register unit, the signal terminals for the clock signals CLK1 to CLK8 have inputted thereto the clock signals CH and CA to CG.

Figure 7A:
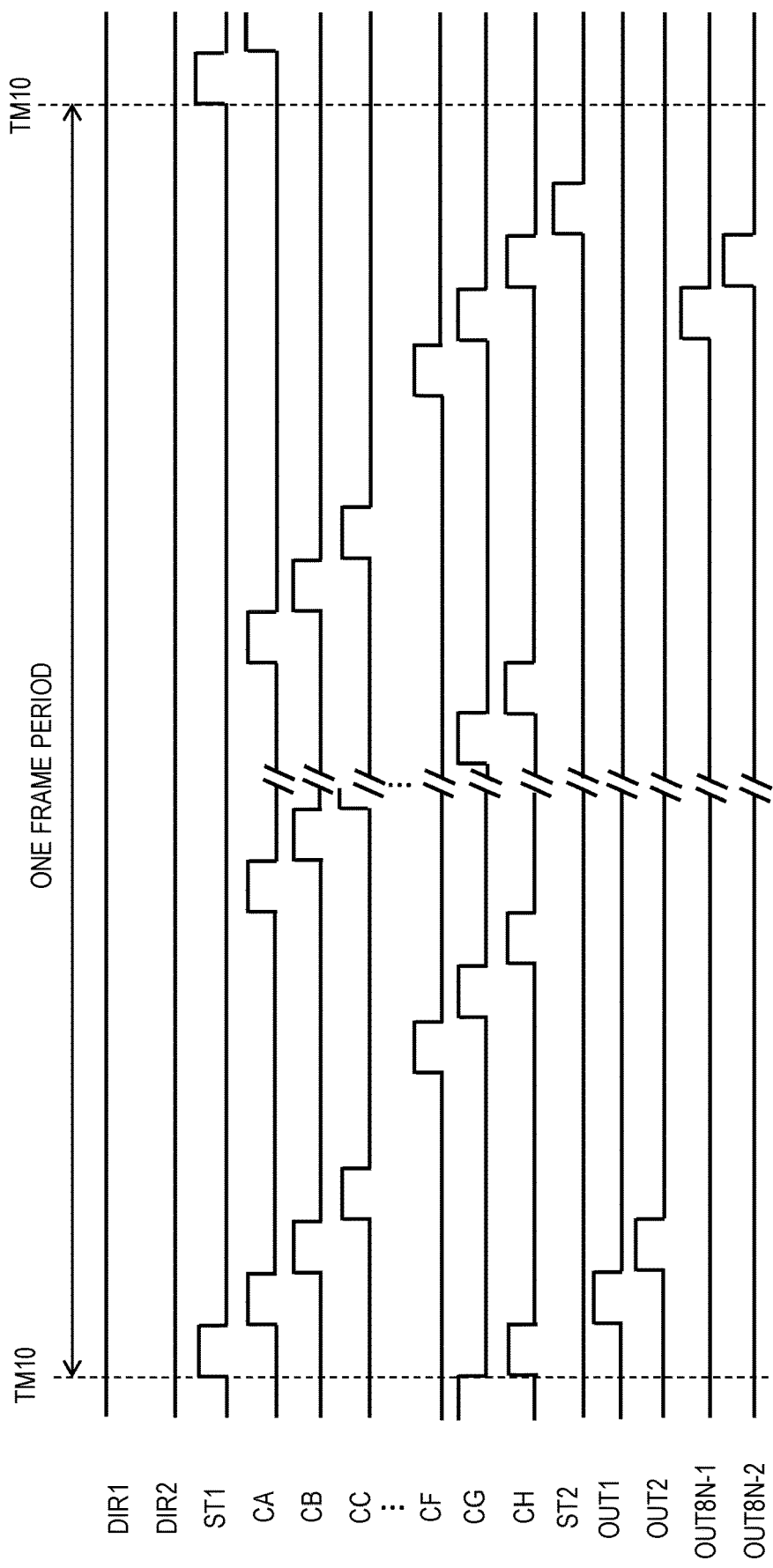
FIG. 7A shows a sequence diagram of signals in the shift register having the configuration shown in FIGS. 6A and 6B.

FIG. 7A shows a sequence diagram of signals in the shift register having the configuration shown in FIGS. 6A and 6B. In the control shown in FIG. 7A, the scanning direction is from the highest stage shift register unit 311 to the lowest stage shift register unit 316. The time TM10 is the start time for each frame period. In each frame period, the control signal DIR1 is at the high level (VGH), and the control signal DIR2 is at the low level (VGL). At the time TM10, the pulse of the start signal ST1 is generated. Then, the start signal ST1 remains at the low level (VGL) until the next frame period.

With the end of the pulse of the start signal ST1, the pulse of the clock signal CA is generated. The end time for the pulse of the start signal ST1 substantially coincides with the start time of the pulse of the clock signal CA. With the end of the pulse of the start signal ST1, the pulses of the clock signals CA to CH are sequentially and repeatedly generated. Regarding the clock signals CA to CH, with the end of the previous pulse, the subsequent pulse is generated. In the example of FIG. 7A, the end time and start time of consecutive pulses substantially coincide. However, these times need not necessarily coincide.

The shift register units output sequential ON pulses from the highest stage shift register unit 311 to the lowest stage shift register unit 316. In FIG. 7A, a pulse is generated in the output signal OUT1 of the first shift register unit 311, and then, a pulse is generated in the output signal OUT2 of the next stage shift register unit 312. Then, subsequent stage shift register units output sequential pulses, and lastly, an ON pulse is generated in the output signal OUT8N of the lowest stage shift register unit 316.

Figure 7B:
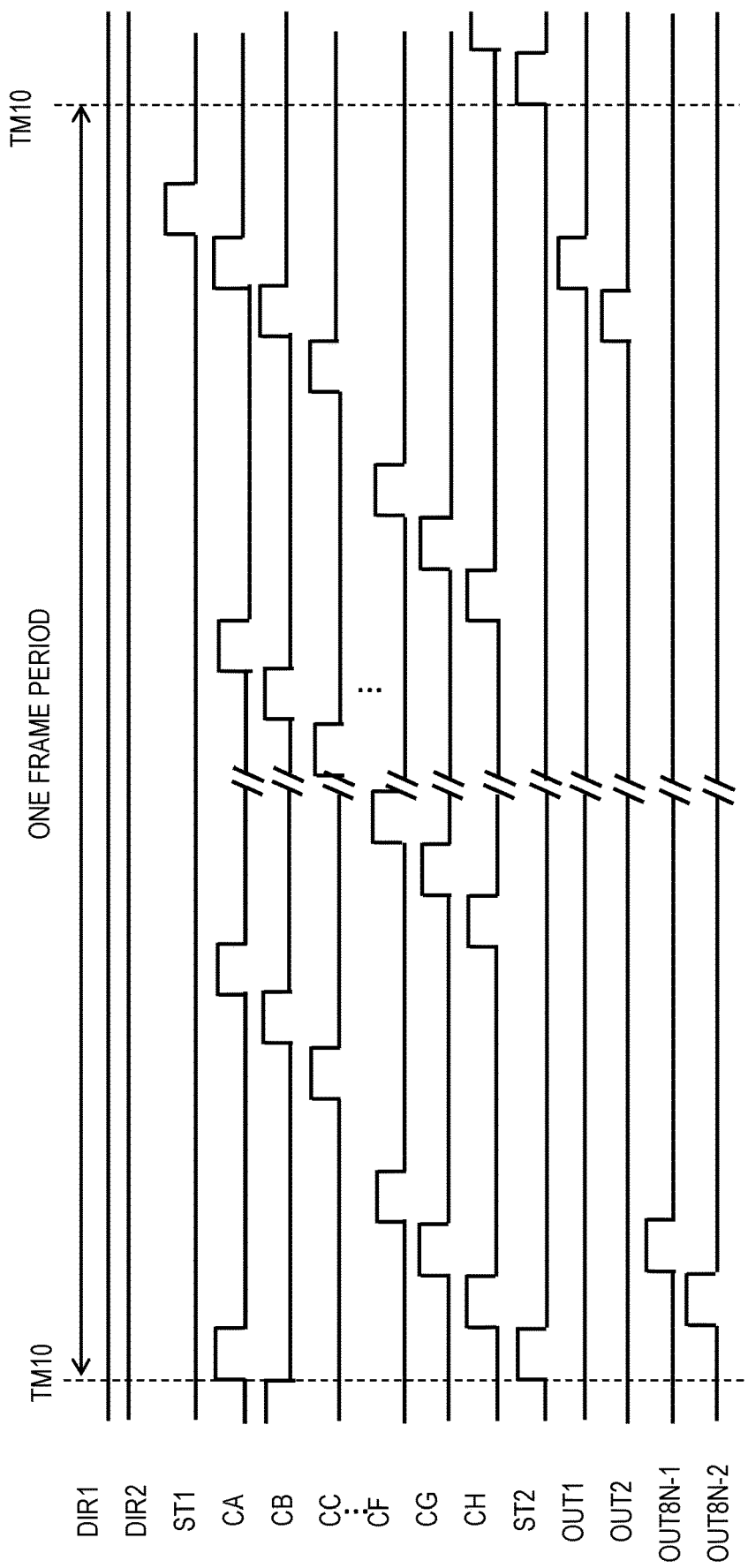
FIG. 7B shows another sequence diagram of signals in the shift register having the configuration shown in FIGS. 6A and 6B.

FIG. 7B shows another sequence diagram of signals in the shift register having the configuration shown in FIGS. 6A and 6B. In the control shown in FIG. 7B, the scanning direction is from the lowest stage shift register unit 316 to the highest stage shift register unit 311. The time TM10 is the start time for each frame period. In each frame period, the control signal DIR1 is at the low level (VGL), and the control signal DIR2 is at the high level (VGH). At the time TM10, the pulse of the start signal ST2 is generated. Then, the start signal ST2 remains at the low level (VGL) until the next frame period.

With the end of the pulse of the start signal ST2, the pulse of the clock signal CH is generated. The end time for the pulse of the start signal ST2 substantially coincides with the start time of the pulse of the clock signal CH. With the end of the pulse of the start signal ST2, the pulses of the clock signals CH to CA are sequentially and repeatedly generated. Regarding the clock signals CH to CA, with the end of the previous pulse, the subsequent pulse is generated. In the example of FIG. 7B, the end time and start time of consecutive pulses substantially coincide. However, these times need not necessarily coincide.

The shift register units output sequential ON pulses from the lowest stage shift register unit 316 to the highest stage shift register unit 311. In FIG. 7B, a pulse is generated in the output signal OUT8N of the first shift register unit 361, and then, a pulse is generated in the output signal OUT8N-1 of the next stage shift register unit 315. Then, subsequent stage shift register units output sequential pulses, and lastly, an ON pulse is generated in the output signal OUT1 of the highest stage shift register unit 311.

The pull-down N-type TFT in the shift register unit causes a fluctuation in Id-Vg characteristics (Vth fluctuation) due to positive bias stress during the ON state. In the n-type TFT, for example, the Vth voltage fluctuates towards the high voltage side. As a result, the driving performance of the pull-down TFT is reduced, and the TFT cannot be accurately controlled. This is thought to be due to charge injection into the gate insulating film and sequential formation in the semiconductor film. Fluctuation in characteristics is particularly high in the case of amorphous silicon, and can also occur in other semiconductors such as oxide semiconductors and low temperature polysilicon semiconductors, as well as pull-up P-type TFTs. Pull-up TFTs are TFTs for raising a given node to the high power source potential VGH. Either one of the source and the drain of the pull-up TFT is connected to the given node and the other is connected to the power source line for the high power source potential.

As described above, according to one embodiment of the present specification, the plurality of pull-down transistors (TFTs) T5 to T12 are connected in parallel to the output line OT of the shift register units, and are controlled to be ON/OFF by different clock signals CLK1 to CLK8. The pull-down TFTs connected in parallel are cyclically and sequentially turned ON/OFF.

As a result, each pull-down TFT is driven at a low duty cycle. As a result, the proportion of the ON state period is reduced, and thus, it is possible to mitigate fluctuations in characteristics of the pull-down TFTs. Also, the proportion of the OFF state period is increased, and thus, a fluctuation in characteristics opposite to the fluctuation in characteristics for the ON state is promoted. As a result, a decrease in driving performance for the pull-down TFTs is effectively mitigated. Also, as described with reference to FIGS. 4 and 5, the transistor T2 is a pull-down TFT of the node N1 and the proportion of the ON state thereof is similarly small to the transistor T5. Thus, it is possible to effectively mitigate a decrease in driving capability of the transistor T2.

The duty cycle of the pull-down transistors connected to the output line is dependent on the number of clock signals that control the transistors. The duty cycle of the pull-down transistors matches the duty cycle for the high level of the clock signals. FIG. 8 schematically shows the relationship between the number of clock signals and the duty cycle. Where the number of clock signals is 2, 4, 8, 10, 16, and 20, the duty cycles thereof are respectively 50%, 25%, 12.5%, 10%, 6.25%, and 5% or less.

Figure 9:
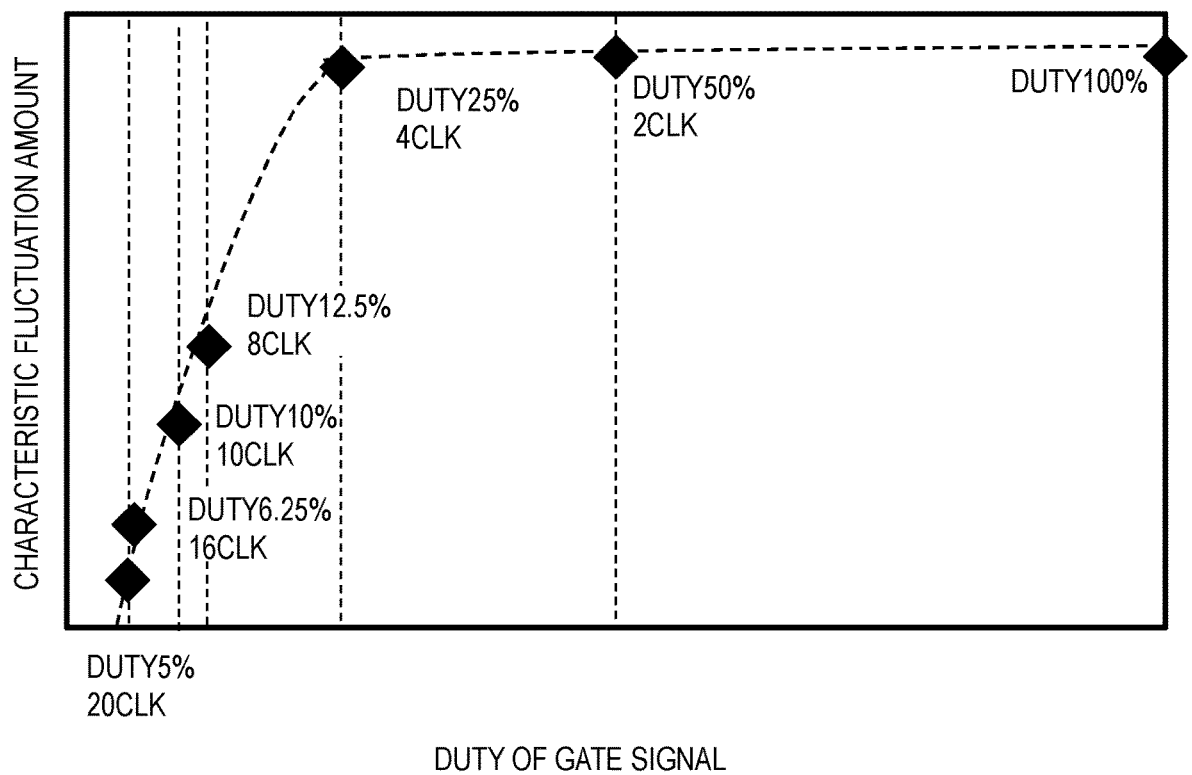
FIG. 9 shows measurement results of the relationship between the duty cycle of the gate signal and the fluctuation in characteristics of the amorphous silicon N-type TFT.

FIG. 9 shows measurement results of the relationship between the duty cycle of the gate signal and the fluctuation in characteristics of the amorphous silicon N-type TFT. Measurement was conducted by continuously applying gate signals of differing duty cycles to the gate of the amorphous silicon N-type TFT for 500 hours. As indicated by the measurement results of FIG. 9, there is no substantial change in the amount of fluctuation in characteristics from a duty cycle of 100% to 25%. The amount of fluctuation in characteristics greatly decreases as the duty cycle decreases from 25% to 12.5%. Thus, the duty cycle of the gate signal is important in effectively mitigating fluctuation in characteristics of pull-down TFTs, and it is possible to greatly reduce fluctuation in characteristics by setting the duty cycle to 12.5% or less.

As described above, the fluctuation in characteristics of TFTs is most prominent for amorphous silicon. Thus, by setting the duty cycle to 12.5% or less, it is possible to effectively mitigate fluctuation in characteristics in pull-down TFTs or pull-up TFTs made of an oxide semiconductor or a low temperature polysilicon.

In the configuration example described with reference to FIGS. 4 and 5, the eight pull-down transistors T5 to T12 are controlled by clock signals CLK1 to CLK8 that respectively differ from each other. By applying non-overlapping (separated) ON periods to the transistors T5 to T12, it is possible to reduce the duty cycle of each pull-down transistor to 12.5% or less.

The number of pull-down transistors connected to the output line is determined by design, and may be greater or less than eight. By adjusting the clock signals that control the pull-down transistors, it is possible to reduce the duty cycle of each pull-down transistor to 12.5% or less. One clock signal may simultaneously control a plurality of pull-down transistors.

Embodiment 2

Next, a configuration example will be described in which each scanning line 206 is driven by shift register units disposed on both sides of the display region 125. By setting the left and right frame widths of the liquid crystal display device to be closer, it is possible to improve display characteristics of the liquid crystal display device. By disposing the shift register units on both sides of the display region 125, it is possible to improve display characteristics while reducing the size of the frame region.

Figure 10:
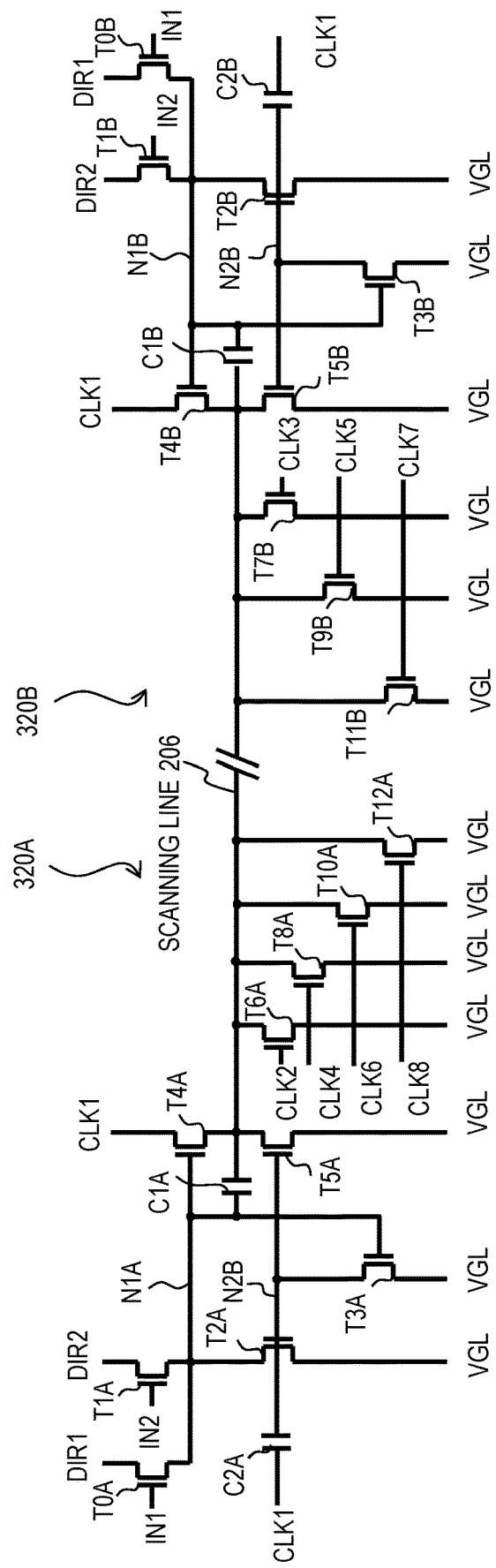
FIG. 10 shows a configuration example of shift register units on both sides that output an output signal to one scanning line.

FIG. 10 shows a configuration example of shift register units 320A and 320B on both sides that output an output signal to one scanning line 206. The shift register units 320A and 320B output a selection pulse of the same width simultaneously to the scanning line 206. Differences from the configuration example shown in FIG. 4 will be primarily described here. Elements assigned the same reference characters as FIG. 4 are the same as the elements in FIG. 4. Signals inputted to the shift register unit 320A include signals IN1, IN2, DIR1, DIR2, CLK1, CLK2, CLK4, CLK6, and CLK8. In contrast to the configuration example of FIG. 4, the clock signals CLK3, CLK5, and CLK7 are omitted.

The shift register unit 320A includes transistors T0A to T6A, T8A, T10A, and T12 and two capacitors C1A and C2A. These respectively correspond to the transistors T0 to T6, T8, T10, and T12 and the capacitors C1 and C2 of the shift register unit 310 of FIG. 4, and have a similar configuration and a similar operation thereto. The node N1A corresponds to the node N1 and the changes in potential thereof are the same. The node N2A corresponds to the node N2 and the changes in potential thereof are the same.

The shift register unit 320B includes transistors T0B to T5B, T7B, T9B, and T11B and two capacitors C1B and C2B. These respectively correspond to the transistors T0 to T5, T7, T9, and T11 and the capacitors C1 and C2 of the shift register unit 310 of FIG. 4, and have a similar configuration and a similar operation thereto. The transistors T7B, T9B, and T11B are examples of the fourth thin film transistors. Alternatively, the transistors T6A, T8A, T10A, and T12A are examples of the fourth thin film transistors. The node N1B corresponds to the node N1 and the changes in potential thereof are the same. The node N2B corresponds to the node N2 and the changes in potential thereof are the same.

Figure 11A:
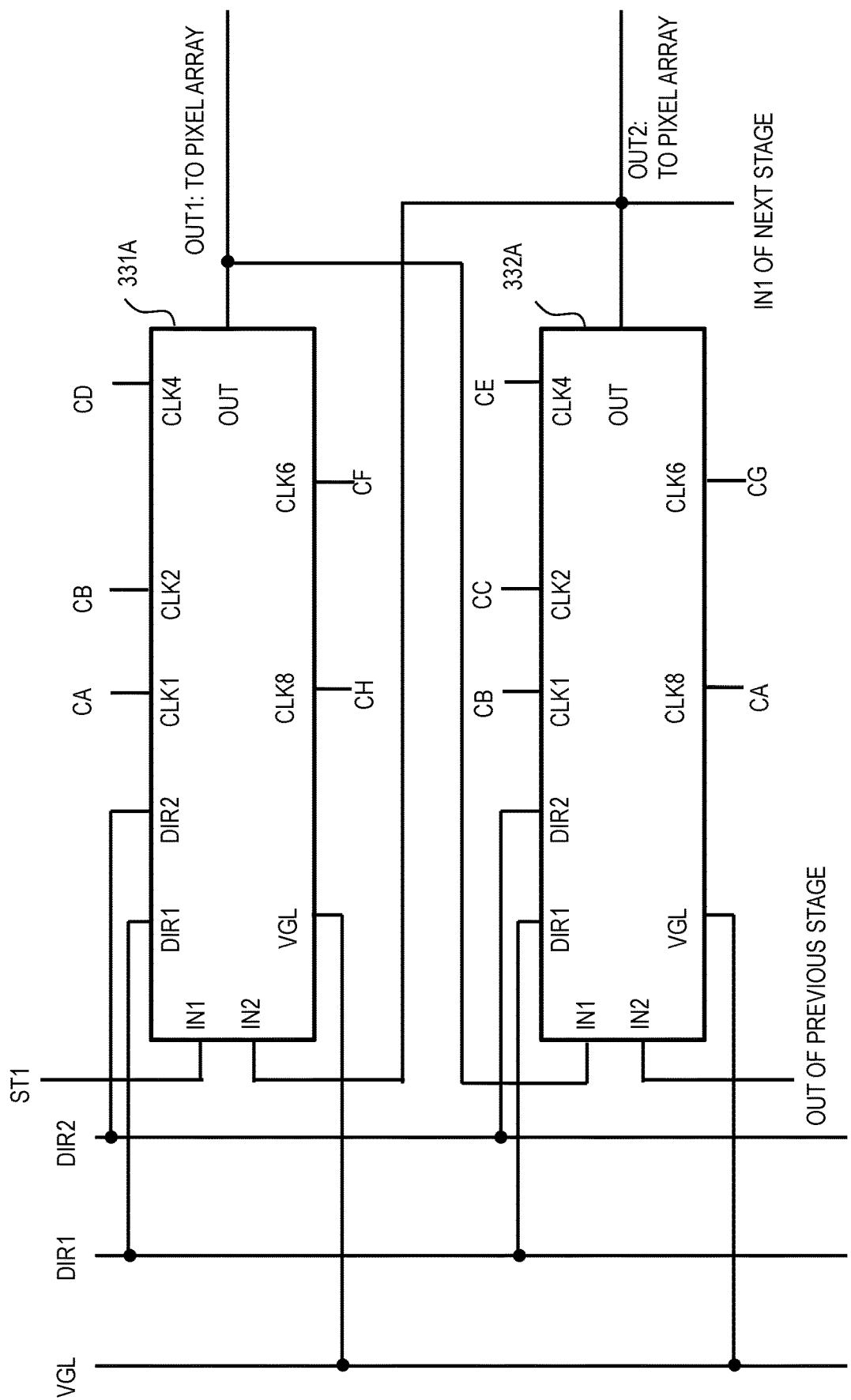
FIG. 11A shows a portion of a shift register that can be installed in the scanning driver.

FIG. 11A shows a portion of a shift register that can be installed in the scanning driver 131. Specifically, FIG. 11A shows the highest stage shift register unit 331A and a lower stage shift register unit 332A (next stage or previous stage) therefrom. The shift register units 331A and 332A can each have the circuit configuration of the shift register unit 320A described with reference to FIG. 10. In this example, the shift register is constituted of 8N linked shift register units (N being positive integer).

Differences from the configuration example shown in FIG. 6A will be primarily described here. Each shift register unit includes a plurality of signal terminals. One signal terminal is an output signal terminal for the output signal OUT. Other signal terminals are input signal terminals for the signals IN1, IN2, DIR1, DIR2, CLK1, CLK2, CLK4, CLK6, and CLK8 and the low power source potential VGL. In contrast to the shift register units 311 and 312 of FIG. 6A, input terminals for the clock signals CLK3, CLK5, and CLK7 are omitted.

A start signal ST1 is inputted to the signal terminal for the signal IN1 of the highest stage shift register unit 331A. An output signal OUT1 of the upper stage (previous stage) shift register unit 331A is inputted to the signal terminal for the signal IN1 of the lower stage shift register unit 332A.

The output signal OUT of the lower stage (previous stage) shift register unit (not shown) therefrom is inputted to the signal terminal for the signal IN2 of the shift register unit 332A. An output signal OUT2 of the lower stage (previous stage) shift register unit 332A is inputted to the signal terminal for the signal IN2 of the shift register unit 331A.

In the shift register unit 331A, the signal terminals for the clock signals CLK1, CLK2, CLK4, CLK6, and CLK8 have inputted thereto the clock signals CA, CB, CD, CF, and CH. In the shift register unit 332A, the signal terminals for the clock signals CLK1, CLK2, CLK4, CLK6, and CLK8 have inputted thereto the clock signals CB, CC, CE, CG, and CA.

Figure 11B:
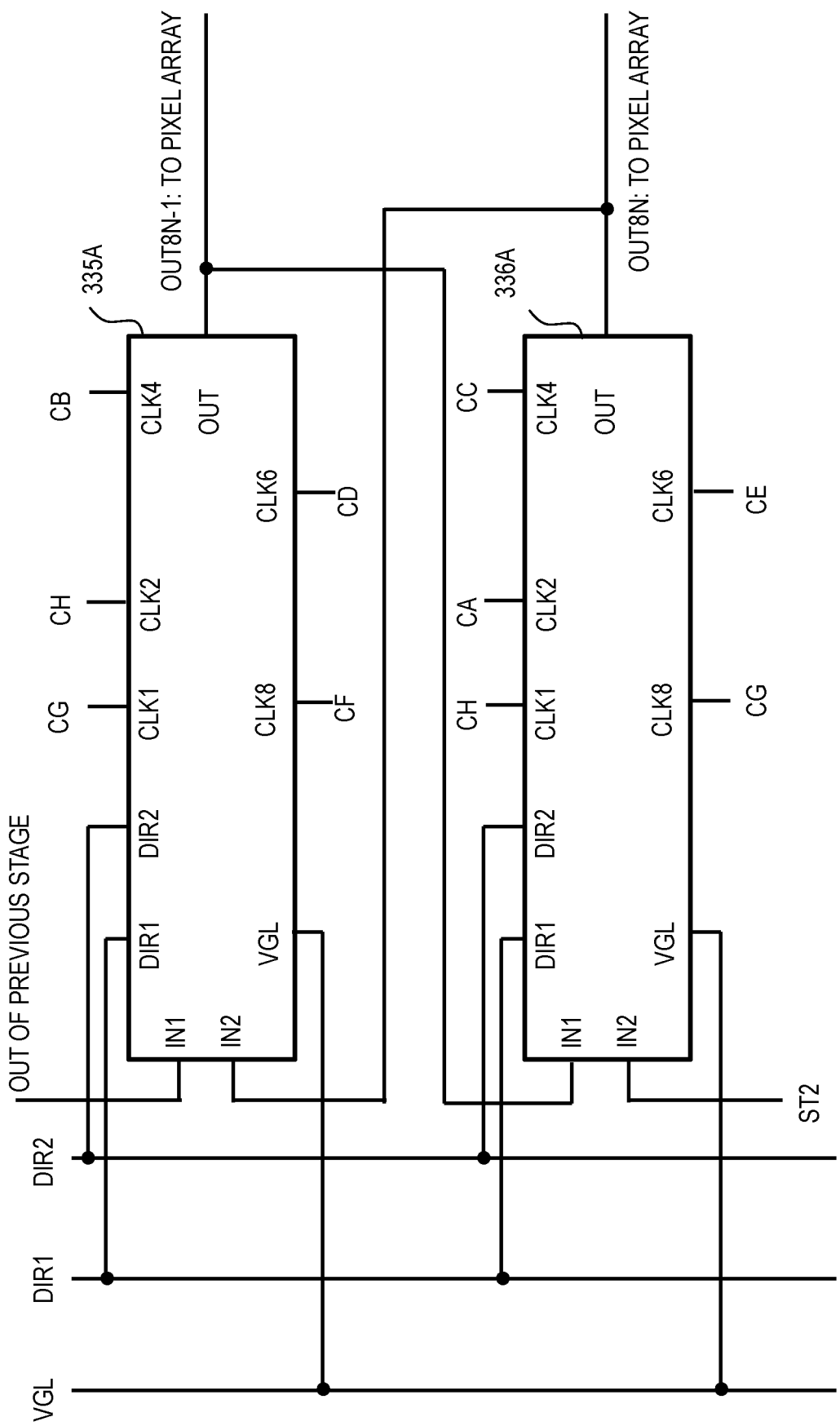
FIG. 11B shows another portion of the shift register that can be installed in the scanning driver.

FIG. 11B shows another portion of the shift register that can be installed in the scanning driver 131. Specifically, FIG. 11B shows the lowest stage shift register unit 336A and an upper stage shift register unit 335A (next stage or previous stage) therefrom. The shift register units 335A and 336A are 8N-1th and 8Nth shift register units from the highest stage. The shift register units 335A and 336A can each have the circuit configuration of the shift register unit 320A described with reference to FIG. 10.

The difference from the shift register units 331A and 332A will be primarily described here. The output signal OUT of the upper stage (previous stage) shift register unit (not shown) is inputted to the signal terminal for the signal IN1 of the shift register unit 335A. An output signal OUT8N-1 of the upper stage (previous stage) shift register unit 335A is inputted to the signal terminal for the signal IN1 of the shift register unit 336A.

A start signal ST2 is inputted to the signal terminal for the signal IN2 of the shift register unit 336A. An output signal OUT8N of the lower stage (previous stage) shift register unit 336A is inputted to the signal terminal for the signal IN2 of the shift register unit 335A.

In the shift register unit 335A, the signal terminals for the clock signals CLK1, CLK2, CLK4, CLK6, and CLK8 have inputted thereto the clock signals CG, CH, CB, CD, and CF. In the shift register unit 336A, the signal terminals for the clock signals CLK1, CLK2, CLK4, CLK6, and CLK8 have inputted thereto the clock signals CH, CA, CC, CE, and CG.

Each of the clock signal terminals of the shift register units of each stage of the shift register shown in FIGS. 11A and 11B has inputted thereto the same clock signal as the corresponding clock signal terminal of the corresponding stage shift register unit in the configuration example shown in FIGS. 6A and 6B.

Figure 12A:
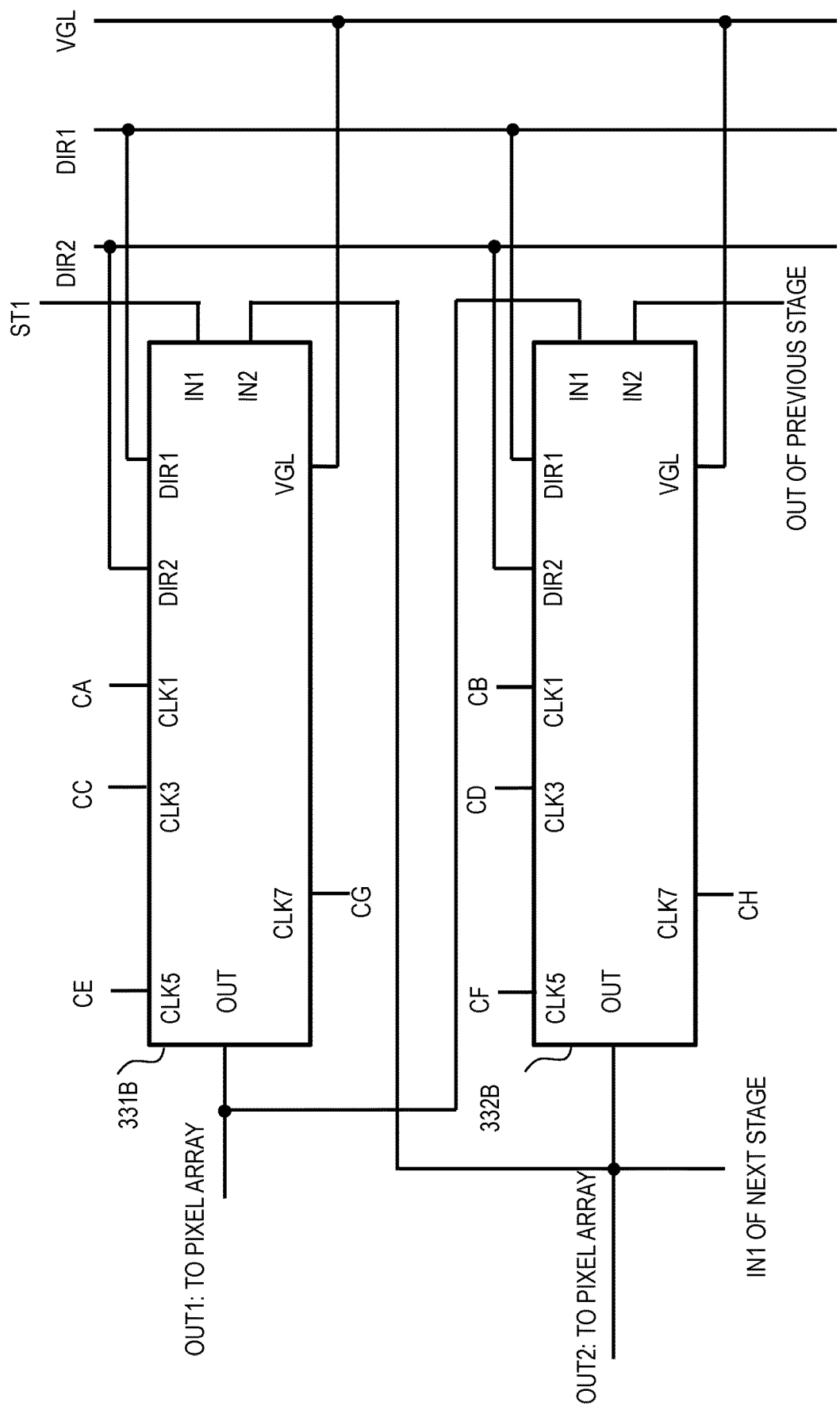
FIG. 12A shows a portion of a shift register that can be installed in the scanning driver.

FIG. 12A shows a portion of a shift register that can be installed in the scanning driver 132. Specifically, FIG. 12A shows the highest stage shift register unit 331B and a lower stage shift register unit 332B (next stage or previous stage) therefrom. The shift register units 331B and 332B can each have the circuit configuration of the shift register unit 320B described with reference to FIG. 10. In this example, the shift register is constituted of 8N linked shift register units (N being positive integer).

Differences from the configuration example shown in FIG. 6A will be primarily described here. Each shift register unit includes a plurality of signal terminals. One signal terminal is an output signal terminal for the output signal OUT. Other signal terminals are input signal terminals for the signals IN1, IN2, DIR1, DIR2, CLK1, CLK3, CLK5, and CLK7 and the low power source potential VGL. In contrast to the shift register units 311 and 312 of FIG. 6A, input terminals for the clock signals CLK2, CLK4, CLK6, and CLK8 are omitted.

A start signal ST1 is inputted to the signal terminal for the signal IN1 of the highest stage shift register unit 331B. An output signal OUT1 of the upper stage (previous stage) shift register unit 331B is inputted to the signal terminal for the signal IN1 of the lower stage shift register unit 332B.

The output signal OUT of the lower stage (previous stage) shift register unit (not shown) therefrom is inputted to the signal terminal for the signal IN2 of the shift register unit 332B. An output signal OUT2 of the lower stage (previous stage) shift register unit 332B is inputted to the signal terminal for the signal IN2 of the shift register unit 331B.

In the shift register unit 331B, the signal terminals for the clock signals CLK1, CLK3, CLK5, and CLK7 have inputted thereto the clock signals CA, CC, CE, and CG. In the shift register unit 332B, the signal terminals for the clock signals CLK1, CLK3, CLK5, and CLK7 have inputted thereto the clock signals CB, CD, CF, and CH.

Figure 12B:
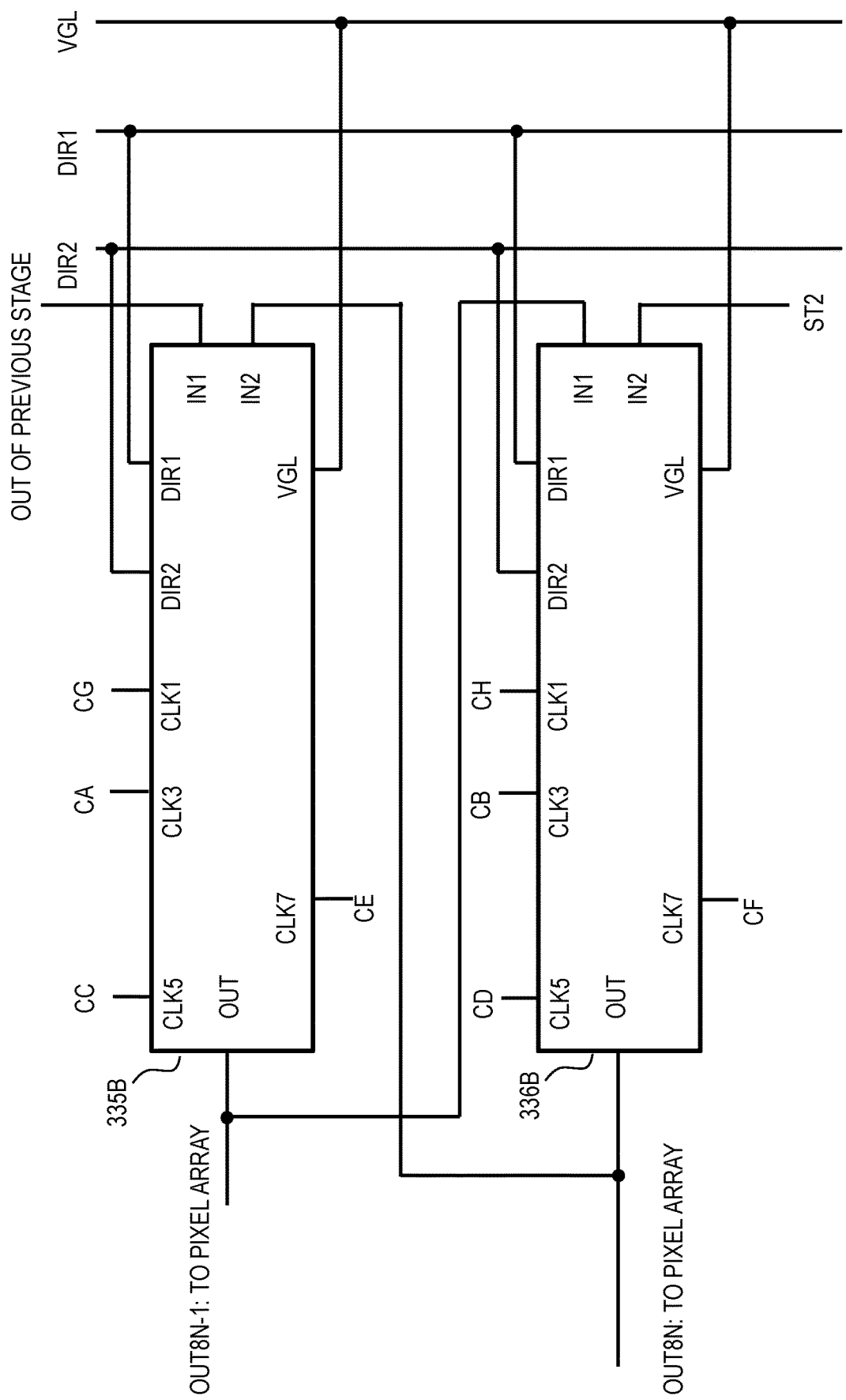
FIG. 12B shows another portion of the shift register that can be installed in the scanning driver.

FIG. 12B shows another portion of the shift register that can be installed in the scanning driver 132. Specifically, FIG. 12B shows the lowest stage shift register unit 336B and an upper stage shift register unit 335B (next stage or previous stage) therefrom. The shift register units 335B and 336B are 8N-1th and 8Nth shift register units from the highest stage. The shift register units 335B and 336B can each have the circuit configuration of the shift register unit 320B described with reference to FIG. 10.

The difference from the shift register units 331B and 332B will be primarily described here. The output signal OUT of the upper stage (previous stage) shift register unit (not shown) is inputted to the signal terminal for the signal IN1 of the shift register unit 335B. An output signal OUT8N-1 of the upper stage (previous stage) shift register unit 335B is inputted to the signal terminal for the signal IN1 of the shift register unit 336B.

A start signal ST2 is inputted to the signal terminal for the signal IN2 of the shift register unit 336B. An output signal OUT8N of the lower stage (previous stage) shift register unit 336B is inputted to the signal terminal for the signal IN2 of the shift register unit 335B.

In the shift register unit 335B, the signal terminals for the clock signals CLK1, CLK3, CLK5, and CLK7 have inputted thereto the clock signals CG, CA, CC, and CE. In the shift register unit 336B, the signal terminals for the clock signals CLK1, CLK3, CLK5, and CLK7 have inputted thereto the clock signals CH, CB, CD, and CF.

Each of the clock signal terminals of the shift register units of each stage of the shift register shown in FIGS. 12A and 12B has inputted thereto the same clock signal as the corresponding clock signal terminal of the corresponding stage shift register unit in the configuration example shown in FIGS. 6A and 6B. The change over time of the input signals and output signals of the two shift registers described with reference to FIGS. 10 to 12B and the operation of the shift registers are as described with reference to FIGS. 7A and 7B.

In the example above, the rise and fall of the selection pulses outputted respectively by the shift register units on both sides of each scanning line 206 occur simultaneously. The number of pull-down TFTs of the scanning line 206 of the shift register unit 320A is five, and the number of pull-down TFTs of the shift register unit 320B is four. Thus, the size of the frame region can be effectively reduced due to the difference in number of pull-down TFTs of the shift register units on both sides of the scanning line being one or less.

The transistors T5A and T5B are simultaneously turned ON/OFF. Other pull-down TFTs of the scanning line 206 are alternately turned ON between the left and right shift register units 320A and 320B. That is, the transistors 6A, 7B, 8A, 9B, 10A, 11B, and 12A are turned ON in the stated order. Thus, by selecting transistors to be turned ON alternately among the shift register units on both sides, it is possible to reduce the impact on display quality from the configuration of controlling the potential of the scanning line using two shift register units.

Embodiment 3

In the embodiment of the present specification described below, pull-down TFTs of an output line (scanning line) of shift register units are intermittently turned ON. After the output line is connected to the low power source line by a pull-down TFT, the pull-down TFT is turned OFF, and the output line is in a floating state until the next pull-down TFT is turned ON. The potential of the output line in the floating state remains at VGL. By inserting a floating period where all pull-down TFTs are turned OFF between pull-down periods where one or more pull-down TFTs are turned ON, the number of pull-down TFTs can be reduced.

Figure 13:
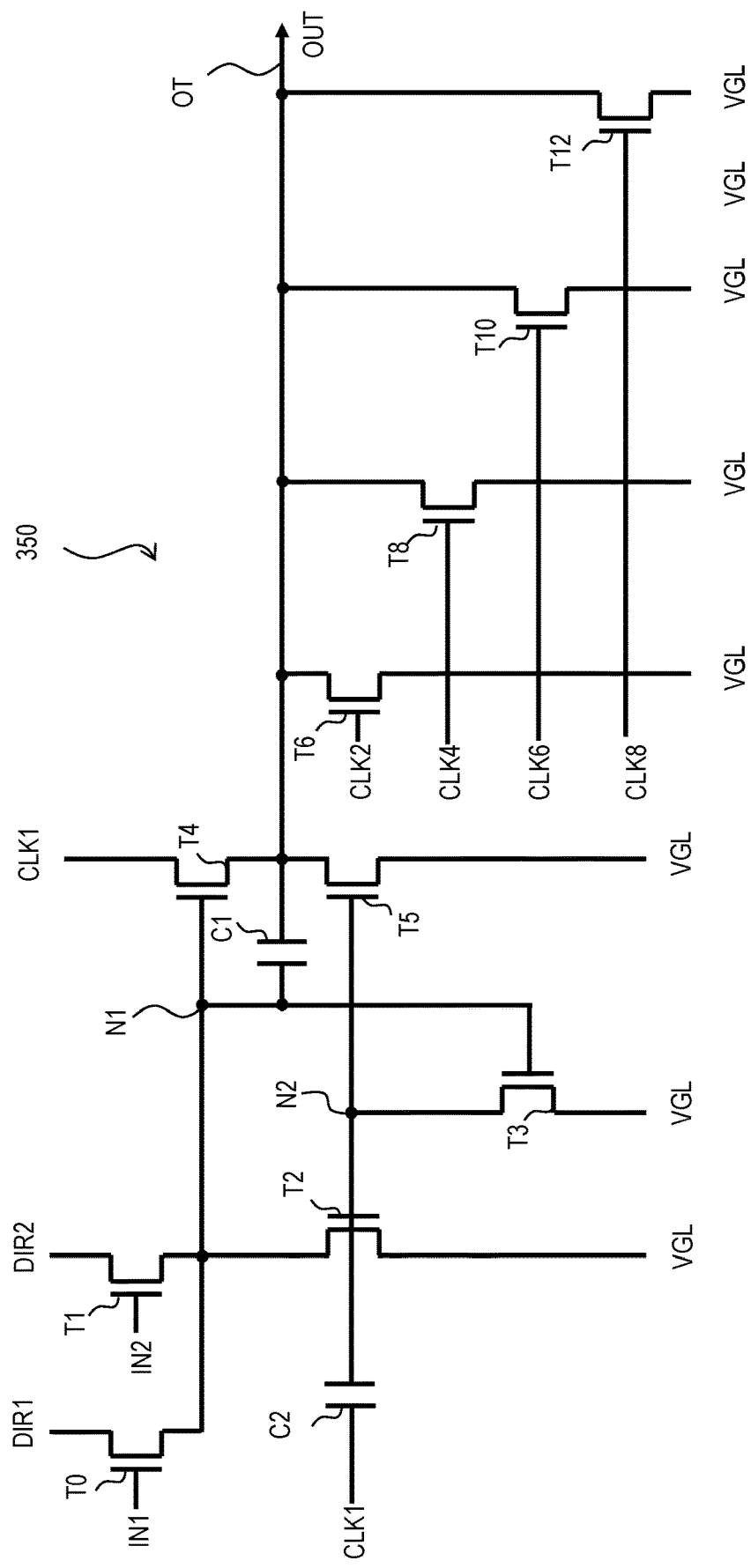
FIG. 13 shows a configuration example of a shift register unit according to one embodiment of the present specification.

FIG. 13 shows a configuration example of a shift register unit 350 according to one embodiment of the present specification. In contrast to the shift register unit 310 shown in FIG. 4, the transistors T7, T9, and T11 are omitted. Other constituent elements are the same as those of the shift register unit 310. Also, among the input signals to be inputted to the shift register unit 310, the clock signals CLK3, CLK5, and CLK7, which respectively control the transistors T7, T9, and T11 are omitted. Other signals are the same as the input signals to be inputted to the shift register unit 310.

The clock signals CLK3, CLK5, and CLK7 are omitted, and thus, the output line is pulled down every clock signal. A floating period is present between the ON pulses of each of the clock signals CLK2, CLK4, CLK6, and CLK5.

Figure 14A:
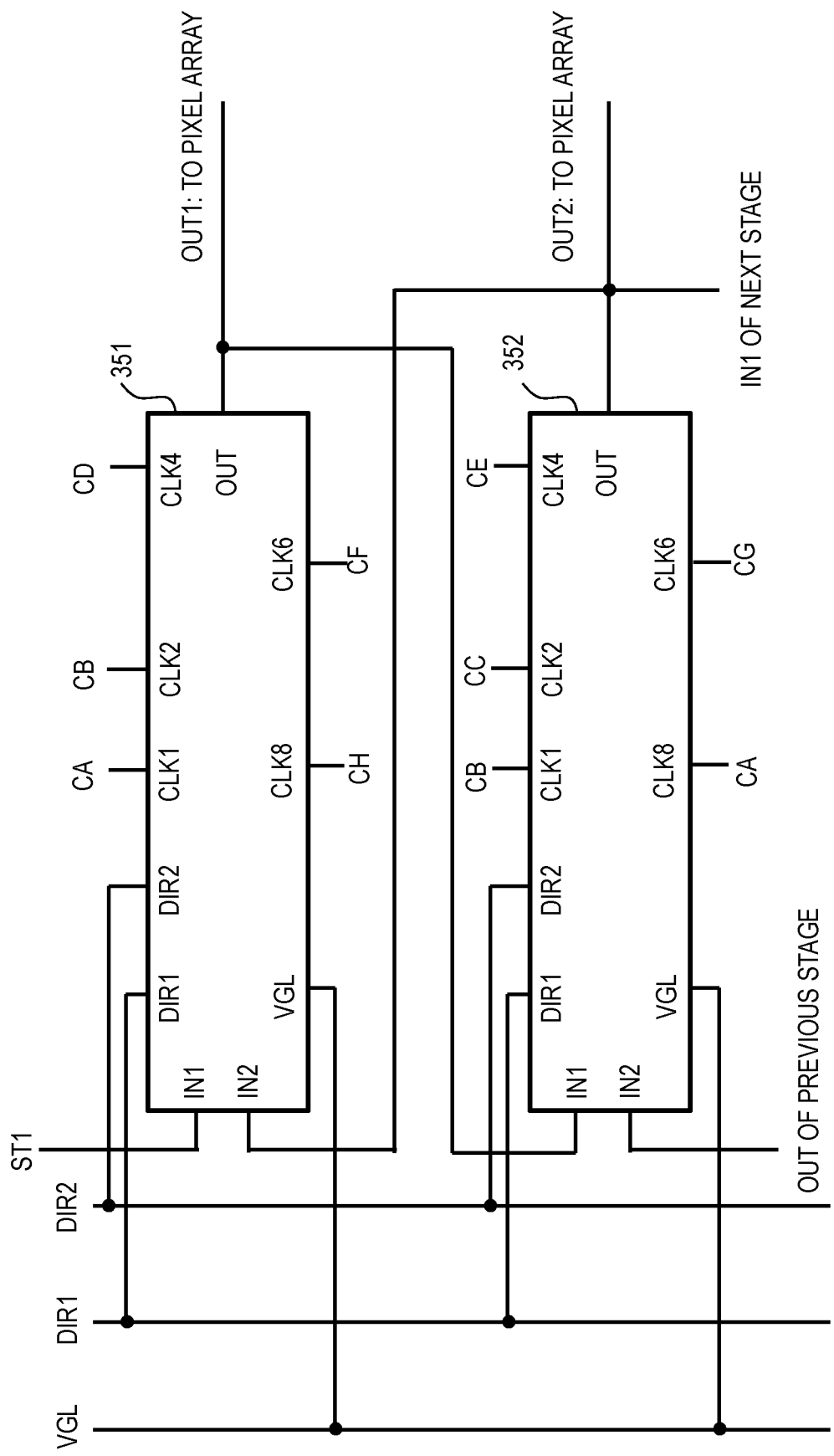
FIG. 14A shows a portion of a shift register that can be installed in the scanning driver.

FIG. 14A shows a portion of a shift register that can be installed in the scanning driver 131 or 132. Specifically, FIG. 14A shows the highest stage shift register unit 351 and a lower stage shift register unit 352 (next stage or previous stage) therefrom. The shift register units 351 and 352 can each have the circuit configuration and operation described with reference to FIG. 13. In this example, the shift register is constituted of 8N linked shift register units (N being positive integer).

In contrast to the configuration example of FIG. 6A, the input terminals for the clock signals CLK3, CLK5, and CLK7 are omitted from the shift register units 351 and 352. Other sections are the same as the configuration example shown in FIG. 6A.

Figure 14B:
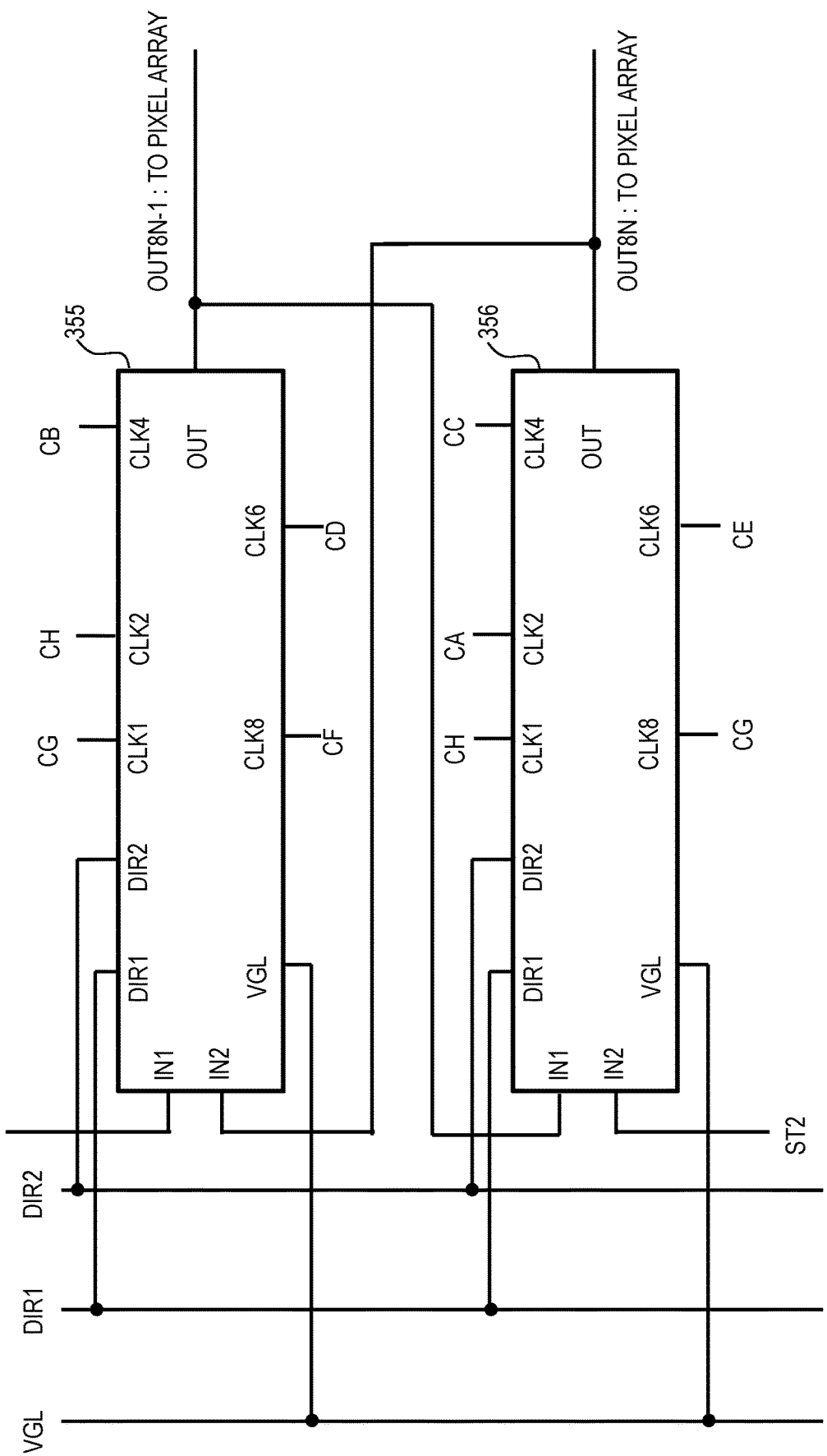
FIG. 14B shows another portion of the shift register that can be installed in the scanning driver.

FIG. 14B shows another portion of the shift register that can be installed in the scanning driver 131 or 132. Specifically, FIG. 14B shows the lowest stage shift register unit 356 and an upper stage shift register unit 355 (next stage or previous stage) therefrom. The shift register units 355 and 356 are 8N-1th and 8Nth shift register units from the highest stage. The shift register units 355 and 356 can each have the circuit configuration and operation described with reference to FIG. 13.

The output signal OUT of the upper stage (previous stage) shift register unit (not shown) is inputted to the signal terminal for the signal IN1 of the shift register unit 355. An output signal OUT8N-1 of the upper stage (previous stage) shift register unit 355 is inputted to the signal terminal for the signal IN1 of the shift register unit 356.

A start signal ST2 is inputted to the signal terminal for the signal IN2 of the shift register unit 316. An output signal OUT8N of the lower stage (previous stage) shift register unit 356 is inputted to the signal terminal for the signal IN2 of the shift register unit 355.

In the shift register unit 355, the signal terminals for the clock signals CLK1, CLK2, CLK4, CLK6, and CLK8 have inputted thereto the clock signals CG, CH, CB, CD, and CF. In the shift register unit 356, the signal terminals for the clock signals CLK1, CLK2, CLK4, CLK6, and CLK8 have inputted thereto the clock signals CH, CA, CC, CE, and CG.

The change over time of the input signals and output signals of the shift register is as described with reference to FIGS. 7A and 7B. The shift register of the present embodiment has a similar configuration to that described with reference to FIGS. 4 to 7B aside from the clock signals not being inputted to the shift register units.

In the example above, the floating period has the same length as each ON period of the pull-down TFTs. The floating period may alternatively be longer than the ON period. The configuration example shown in FIG. 13 may further omit the transistors T8 and T12, for example.

As set forth above, embodiments of the present disclosure have been described; however, the present disclosure is not limited to the foregoing embodiments. Those skilled in the art can easily modify, add, or convert each element in the foregoing embodiments within the scope of the present disclosure. A part of the configuration of one embodiment can be replaced with a configuration of another embodiment or a configuration of an embodiment can be incorporated into a configuration of another embodiment.

What is claimed is:
1. A display device, comprising:
a plurality of pixel circuit rows;
a plurality of selection lines connected to the plurality of pixel circuit rows; and
a shift register including a plurality of linked shift register units,
wherein the plurality of shift register units output sequential selection pulses to the plurality of selection lines,
wherein each of the plurality of shift register units outputs one of the selection pulses to a corresponding selection line among the plurality of selection lines, wherein each of the shift register units includes a plurality of thin film transistors of a first conductivity type that are connected in parallel, and that, during an ON state, connect the corresponding selection lines to a fixed potential wiring line for applying a non-selection level for the one of the selection pulses, wherein, during each frame period, the plurality of thin film transistors are turned ON/OFF by clock signals in different phases, and wherein the duty cycle of the ON period of each of the plurality of thin film transistors during each said frame period is 12.5% or less.

2. The display device according to claim 1, wherein each of the plurality of thin film transistors is an N-type amorphous silicon thin film transistor, and wherein the non-selection level is a low level.

3. The display device according to claim 1, wherein each shift register unit further includes:
a second thin film transistor of the first conductivity type that applies a selection level of the one of the selection pulses to the corresponding selection line in the ON state; and
a third thin film transistor of the first conductivity type that connects the fixed potential wiring line to a gate of the second thin film transistor in the ON state, and
wherein the third thin film transistor is controlled by a same clock signal as one of the plurality of thin film transistors.

4. The display device according to claim 1, wherein the shift register is a first shift register, wherein the display device further comprises a second shift register that is disposed opposite the first shift register across the plurality of selection lines,
wherein the second shift register includes a plurality of linked second shift register units that sequentially output the selection pulses to the plurality of selection lines together with the first shift register,
wherein each of the plurality of second shift register units includes a plurality of fourth thin film transistors of the first conductivity type that are connected in parallel, and that, during the ON state, connect the corresponding selection lines to the fixed potential wiring line that applies a non-selection level for the one of the selection pulses,
wherein, during each of the frame periods, the plurality of fourth thin film transistors are turned ON/OFF by the clock signals in different phases from each other, the clock signals controlling the fourth thin film transistors being different from the clock signals controlling the thin film transistors of the first shift register,
wherein the clock signals of the first shift register have different phases from the clock signals that control the plurality of fourth thin film transistors so that, during each frame period, the thin film transistors of the first shift register and the fourth thin film transistors are turned ON/Off by clock signals in different phases, and
wherein the duty cycle of the ON period of each of the plurality of fourth thin film transistors during each said frame period is 12.5% or less.

5. The display device according to claim 4, wherein a difference between a number of the thin film transistors that connect each of the selection lines of the first shift register to the wiring line that applies the non-selection level and a number of the thin film transistors that, in the second shift register, connect each of the selection lines to the fixed potential wiring line that applies the non-selection level is one or less.

6. The display device according to claim 5, wherein a thin film transistor selected from among the plurality of thin film transistors of the first shift register and a fourth thin film transistor selected from among the plurality of fourth thin film transistors are alternately turned ON.

7. The display device according to claim 1, wherein, during each of the frame periods, the plurality of thin film transistors are cyclically and sequentially turned ON/OFF,
wherein a floating period during which all of the plurality of thin film transistors are turned OFF is present between consecutive ON periods of the plurality of thin film transistors, and
wherein the corresponding selection lines during the floating period are in a floating state.

8. The display device according to claim 7, wherein a length of the consecutive ON periods is less than or equal to a length of the floating period.

9. The display device according to claim 1, wherein, during each of the frame periods, the plurality of thin film transistors are cyclically and sequentially turned ON/OFF, and
wherein an end and a start of consecutive ON periods of the plurality of thin film transistors substantially match.

10. The display device according to claim 1, wherein all of the thin film transistors that connect each of the selection lines to the fixed potential wiring line are controlled by the clock signals of different phases.

* * * * *